(12) United States Patent
Amemiya et al.

(10) Patent No.: US 6,647,086 B2
(45) Date of Patent: Nov. 11, 2003

(54) X-RAY EXPOSURE APPARATUS

(75) Inventors: Mitsuaki Amemiya, Saitama (JP); Yutaka Watanabe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/859,043

(22) Filed: May 17, 2001

(65) Prior Publication Data

US 2002/0009176 A1 Jan. 24, 2002

(30) Foreign Application Priority Data

May 19, 2000 (JP) ........................... 2000-148833

(51) Int. Cl.⁷ ................................. G21K 5/00
(52) U.S. Cl. ............................................ 378/34
(58) Field of Search ............................ 378/34, 122

(56) References Cited

U.S. PATENT DOCUMENTS

| | | | | |
|---|---|---|---|---|
| 4,538,291 A | * | 8/1985 | Iwamatsu | 378/34 |
| 4,896,341 A | | 1/1990 | Forsyth et al. | 378/34 |
| 4,935,947 A | | 6/1990 | Amemiya | 378/110 |
| 5,822,389 A | * | 10/1998 | Uzawa et al. | 378/34 |
| 6,038,279 A | | 3/2000 | Miyake et al. | 378/34 |

FOREIGN PATENT DOCUMENTS

JP 9-115803 5/1997

OTHER PUBLICATIONS

Pearlman, J.S., and J.C. Riordan. "X-ray lithography using a pulsed plasma source," *J. Vac. Sci. Technol.*, 19(4), Nov./Dec. 1981. pp. 1190–1193.

Gutcheck, Robert A. and Julius J. Muray. "Intense plasma source for x-ray microscopy," *SPIE*, vol. 316 *High Resolution Soft X-Ray Optics* (1981). pp. 196–202.

* cited by examiner

*Primary Examiner*—Craig E. Church
(74) *Attorney, Agent, or Firm*—Fitzpatrick, Cella, Harper & Scinto

(57) ABSTRACT

A proximity X-ray exposure apparatus for irradiating a reticle with X-rays generated from an X-ray source and irradiating a substrate with X-rays that have passed through the reticle. The apparatus includes a plasma X-ray source for generating X-rays by producing plasma, and a control device for controlling X-ray intensity distribution by controlling production of the plasma so that the plasma is produced at a plurality of positions in one irradiating operation of the substrate with the X-rays. The control device controls the X-ray intensity distribution in order to control the plurality of positions so that a required amount of defocusing, which is a size of a projection image corresponding to one point on the reticle formed by irradiating the reticle with X-rays generated at the plurality of positions, can be obtained.

28 Claims, 20 Drawing Sheets

FIG. 13

| | |
|---|---|
| URL | http://www.maintain.co.jp/db/input.html |

MALFUNCTION DATABASE INPUT SCREEN

DATE OF OCCURRENCE [ 2000/3/15 ]~404
MODEL [ ********* ]~401
SUBJECT MATTER [ OPERATION ERROR (START-UP ERROR) ]~403
EQUIPMENT SERIAL NO. [ 465NS4580001 ]~402
DEGREE OF URGENCY [ D ]~405

CONDITION [ LED CONTINUES FLASHING AFTER POWER IS TURNED ON ]~406

COUNTERMEASURE METHOD [ POWER TURNED ON AGAIN (RED BUTTON PUSHED AT START UP) ]~407

PROGRESS REPORT [ TEMPORARY MEASURES COMPLETED ]~408

[SEND] [RESET]    410              411              412
LINK TO DATABASE OF RESULTS    SOFTWARE LIBRARY    OPERATION GUIDE

SEMICONDUCTOR DEVICE MANUFACTURING FLOW

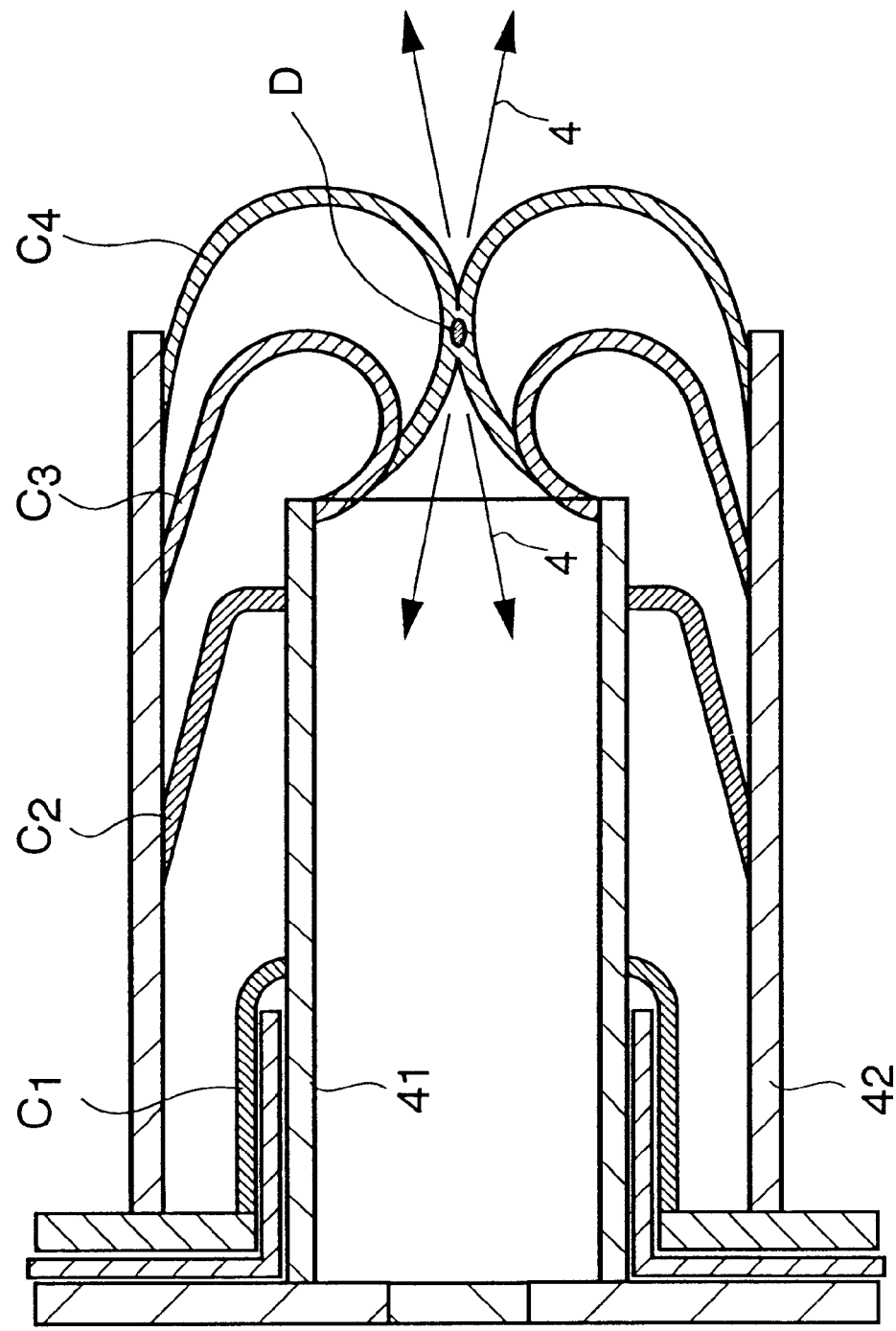

X-RAY EXPOSURE APPARATUS

FIELD OF THE INVENTION

This invention relates to an X-ray exposure apparatus used in the manufacture of various devices, namely semiconductor chips such as IC and LSI chips, display devices such as liquid crystal panels, detector elements such as magnetic heads and image sensing devices such as CCDs, to a reticle such as a mask and to a device manufacturing method using the reticle.

BACKGROUND OF THE INVENTION

The recent increase in density and operating speed of semiconductor integrated circuits has been accompanied by a decrease in pattern-line width of integrated circuits. Semiconductor manufacturing methods also demand much higher performance. For this reason, steppers utilizing shorter and shorter exposure wavelengths, e.g., extreme ultraviolet rays such as KrF lasers (having a wavelength of 248 nm), ArF lasers (having a wavelength of 193 nm) and $F_2$ lasers (having a wavelength of 157 nm) and X-rays (0.2~1.5 nm), have been developed for exposure apparatus used in the formation of a resist pattern in the lithography part of the semiconductor manufacturing process.

With exposure using X-rays, an X-ray mask serving as a reticle on which a desired pattern has been formed is brought into close proximity with a wafer serving as a resist-coated substrate, and the X-ray mask is irradiated from above with X-rays to transfer the mask pattern to the wafer.

A method of exposure using synchrotron light emission has been proposed for the purpose of obtaining high-intensity X-rays in such an X-ray exposure technique, and it has been shown that a pattern can be transferred with a wavelength of less than 100 nm. The synchrotron radiation light source, however, requires elaborate facilities. Though the source is effective in the production of semiconductor devices, it is not suitable for small devices used in prototypes, for example. Accordingly, there has also been proposed an exposure apparatus that employs an X-ray source which is small enough to be usable in prototypes and which generates X-rays of high intensity. One example is referred to as a "laser plasma ray source", as illustrated in the specification of U.S. Pat. No. 4,896,341. This apparatus irradiates a target with laser light from a laser to generate a plasma, and uses X-rays that are produced from the plasma. Another example generates a pinch plasma by electrical discharge in a gas, and produces X-rays from this plasma, as described in the Journal of Vacuum Science Technology 19(4), November/December 1981, p. 1190.

Though not of the proximity type, an X-ray source having a plurality of plasma X-ray emission points is proposed in the specification of Japanese Patent Application Laid-Open No. 9-115803.

Regardless of which light source is used, the resolution of the transferred pattern declines because diffraction is utilized in proximity X-ray exposure. The wavelength of X-rays is short and does not cause a decline in resolution. However, it has been found that the decline in resolution becomes a problem as the pattern to be transferred becomes extremely fine.

For example, X-ray intensity distribution on the surface of a wafer is as indicated by the solid line in FIG. 4. The curve is obtained as the result of calculation by Fresnel integration, in which the thickness of the absorbing body was 0.25 μm, the spacing between the X-ray mask and wafer was 10 μm and the mask was irradiated with perfectly collimated X-rays. The mask had a line-and-space pattern of transparent portion 90 nm/absorbing body 90 nm. A peak in X-ray intensity appears below the transparent portion and at other locations as well. When this pattern is transferred to a negative resist and then developed, the resist at locations where the X-ray intensity is greater than a fixed value remains after development and is resolved as a pattern. The fixed value is considered to be a slice level and is decided by the type of resist, development time, type of developing solution and temperature. In the case of a chemical amplification resist, the fixed value is decided also by the PEB (Post-Exposure Bake) conditions, namely temperature and time.

For example, FIG. 4 illustrates the result obtained by normalizing the X-ray intensity distribution on the wafer surface by the X-ray intensity below a sufficiently large transparent portion. It is believed that if the slice level is 1.0, the resist between X1 and X2 will remain after development. Though the width of the resist pattern is, accurately speaking, different from the size L12 (=X2−X1) of the optical image, it will be understood that they approximately coincide, with the value being 66 nm.

Next, the size of the transparent portion is gradually changed, the X-ray intensity distribution is calculated and the width of the resist pattern is found from the size of the optical image. This is indicated by the solid line in FIG. 6. Here the width of the transparent portion is plotted along the horizontal axis and the size of the resist pattern along the vertical axis. The slice level is changed to 0.8, 0.6 and 0.4, as indicated by the dotted line, broken line and dot-and-dash line, respectively.

However, it will be understood from FIG. 6 that there is a region of transparent portions in which the width of the resist pattern does not necessarily increase but decreases instead and a region in which there is no change in the width of the resist pattern as the mask pattern size, i.e., the size of the transparent portion, increases. This indicates that performing exposure using a mask consisting of a mixture of patterns having a plurality of sizes in these regions is difficult.

It will be appreciated from the foregoing that a region in which the resist pattern does increase in size exists, regardless of the fact that the mask pattern is enlarged in size and there is an increase in the amount of X-rays that arrive at the mask surface, thus making it difficult to transfer the mask pattern. The reason for this is as follows: In this region of mask pattern sizes, X-rays that have passed through the transparent portion collect in the diffraction peak and act in a direction that raises X-ray intensity and not in a direction that broadens the width of the X-ray intensity pattern. For example, FIG. 5 illustrates an X-ray intensity distribution in which the size of the transparent portion is 220 nm. However, when this is compared with an X-ray distribution (FIG. 4) in which the size of the transparent portion is 90 nm, it is seen that the peak intensity is 1.5 times higher in FIG. 5. Since the peak intensity increases more than the ratio of the transparent portion sizes, the width of the peak decreases rather than increases regardless of the fact that the transparent portion size increases.

If the X-ray dose for which the diffraction peak intensity has risen can be converted by some method to a direction that enlarges the width of the diffraction peak, i.e., if the X-ray intensity distribution can be defocused by a suitable amount, then it should be possible to enlarge the width of the resist pattern along with the size of the mast pattern.

As a means for achieving this, it is considered to change the shape of the mask absorbing body or the X-ray spectrum to thereby change the X-ray intensity distribution on the surface of the wafer. However, this method not only complicates the apparatus but also may make it impossible to obtain the desired pattern. A better method is desired.

SUMMARY OF THE INVENTION

The accompanying drawings, which are incorporated in and constitute a part of the specification, illustrate embodiments of the invention and, together with the description, serve to explain the principles of the invention.

Accordingly, an object of the present invention is to make it possible to enlarge the width of a resist pattern with an increase in the size of the mask pattern.

Another object of the present invention is to provide a proximity-type X-ray exposure apparatus and method in which controllable parameters can be increased and a more suitable resist pattern obtained.

According to the present invention, the foregoing objects are attained by providing an X-ray exposure apparatus which includes an X-ray source having a target and a laser light source for irradiating the target with laser light to produce X-rays by the generation of a plasma, wherein a reticle and a substrate disposed in close proximity to each other via a predetermined proximity gap are irradiated with the X-rays to transfer a pattern on the reticle to the substrate by exposure, characterized in that the X-ray source irradiates a plurality of positions on the target with the laser light during exposure.

The present invention further provides a device manufacturing method characterized in that when a target is irradiated with laser light to produce X-rays by the generation of a plasma, and a reticle and a substrate disposed in close proximity to each other via a predetermined proximity gap are irradiated with the X-rays to thereby transfer a pattern on the reticle to the substrate by exposure, a plurality of positions on the target are irradiated with the laser light during exposure. Means for irradiating the plurality of positions with laser light may comprise a mirror for changing the angle of the laser light by reflecting the laser light, which is for irradiating the target, or a plurality of laser light sources focused on different positions of the target.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 13 shows a specific example of a user interface;

FIG. 18 is a diagram illustrating a coaxial-type plasma X-ray source.

DESCRIPTION OF THE PREFERRED EMBODIMENTS

Preferred embodiments of the present invention will now be described in detail in accordance with the accompanying drawings.

The present invention utilizes defocusing produced when exposure to X-rays is performed. Utilizing defocusing means performing a physical operation that corresponds to calculation for convoluting the X-ray intensity distribution on the wafer surface, and obtaining an exposure intensity distribution that differs from the X-ray intensity distribution on the wafer surface in a case where defocusing is not utilized.

Obtaining an exposure intensity distribution means convoluting a parallel X-ray intensity distribution to make it an intensity distribution that will be obtained upon completion of exposure. First, a calculation for determining how much defocusing should be utilized will be illustrated. A graph in which the X-ray intensity distribution of FIG. 4 has been convoluted with a normal distribution function is indicated by the dotted and dashed lines. The dotted and dashed lines have been convoluted with normal distribution functions, wherein it is assumed that the amount of defocusing is taken as standard deviations of σ=30 nm and σ=50 nm, respectively.

Figure 6:
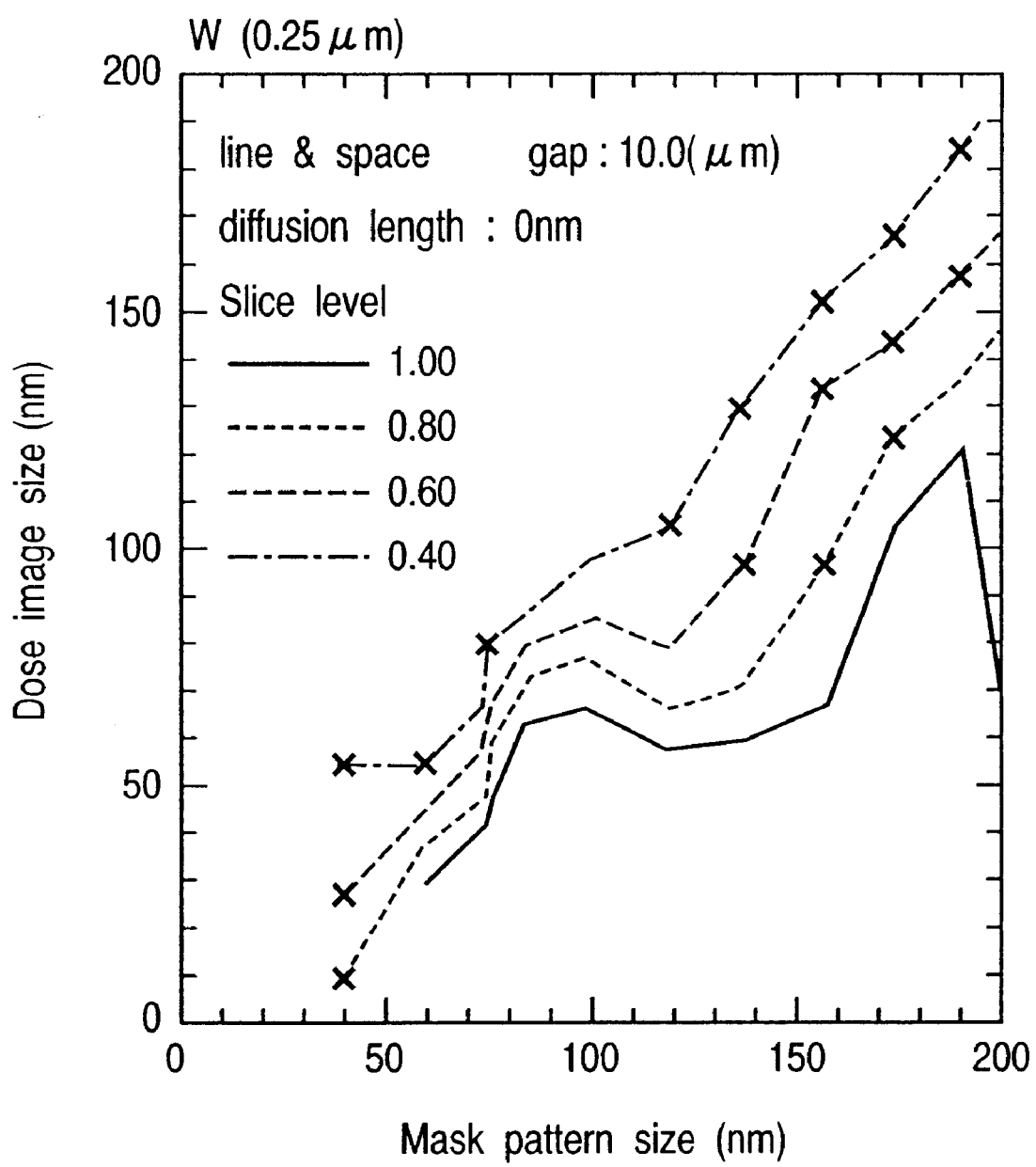
FIG. 6 is a diagram illustrating the relationship between the line width of a mask pattern and the line width of a resist pattern resulting from exposure using an X-ray exposure apparatus according to the prior art.
Figure 7:
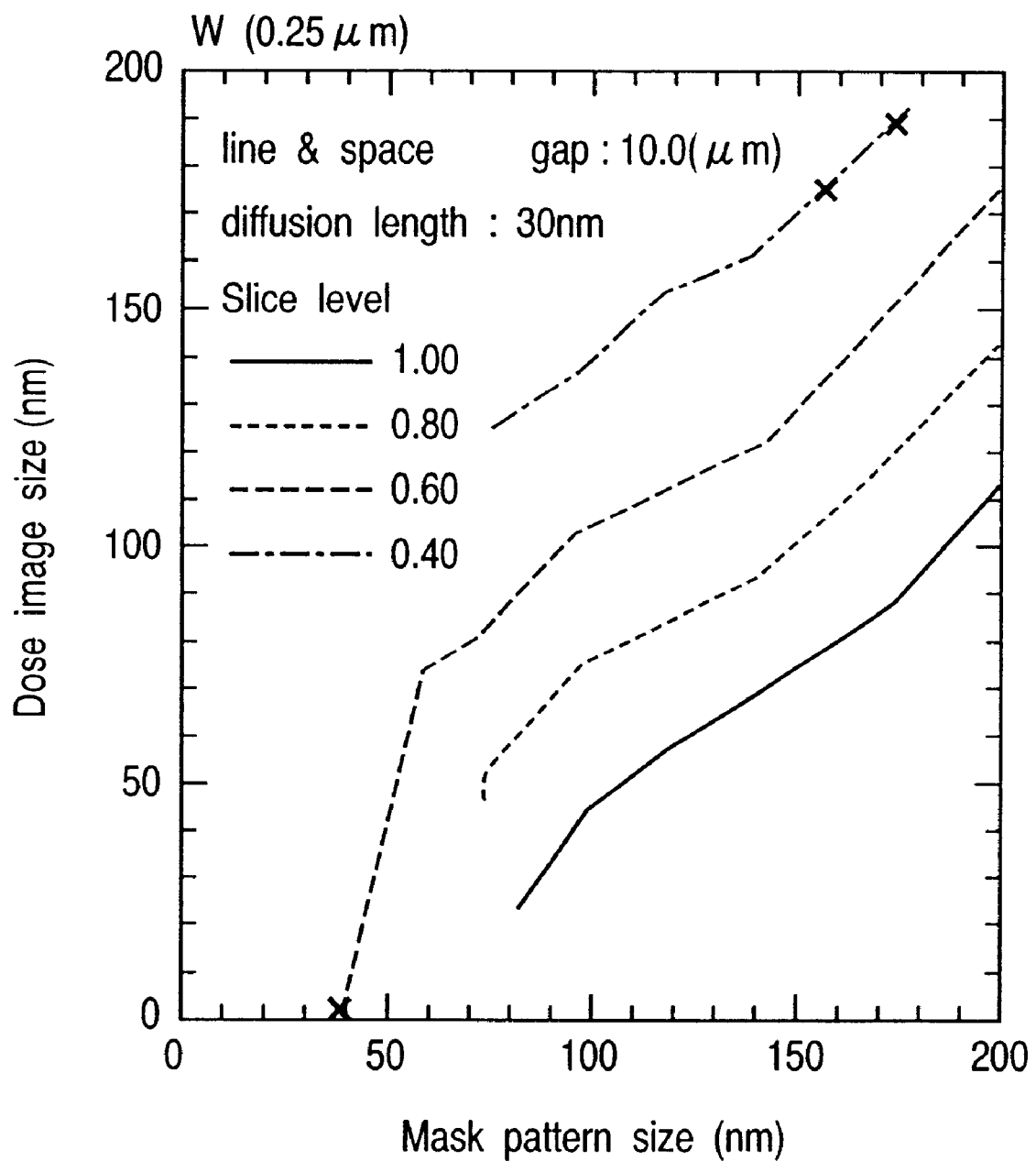
FIG. 7 is a diagram illustrating an example of the relationship between the line width of a mask pattern and the line width of a resist pattern resulting from exposure using an X-ray exposure apparatus according to the present invention.

In a manner similar to FIG. 6, the X-ray intensity distribution at the transparent portion of each size is convoluted at σ=30 nm, the slice levels are taken as 1.0, 0.8, 0.6 and 0.4, and the line width of the resist is found at each slice level. This is shown in FIG. 7. As will be understood from FIG. 7, even if the size of the mask pattern is increased, a region in which the resist pattern does not increase in size does not exist. This indicates that the amount of change in the mask pattern and the amount of change in the resist pattern are fairly close, i.e., that a linear relationship exists between the amounts of change in the mask pattern and resist pattern. This means the resist pattern can be transferred to the mask pattern faithfully.

Figure 8:
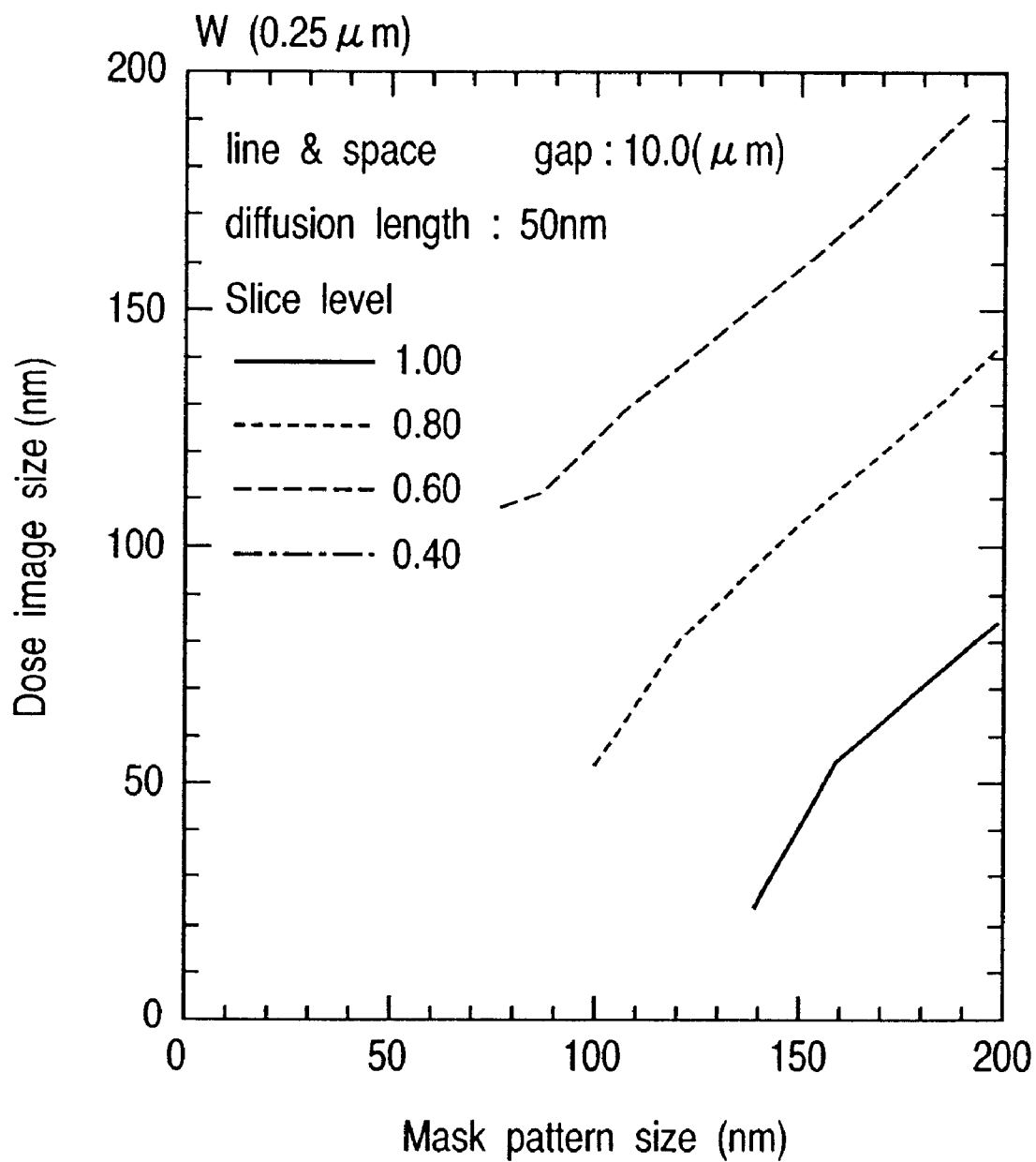
FIG. 8 is a diagram illustrating another example of the relationship between the line width of a mask pattern and the line width of a resist pattern resulting from exposure using an X-ray exposure apparatus according to the present invention.

Further, FIG. 8 illustrates the relationship between the mask pattern and resist pattern in a case where the standard deviation σ is made 50 nm. The slice levels and gap are the same as those in FIG. 7. It will be appreciated that in comparison with FIG. 7 (σ=30 nm), better linearity is achieved in FIG. 8 (σ=50 nm). In other words, this means that the faithfulness of the resist pattern to the mask pattern is increased. However, there is an increase in the minimum dimensions that can be resolved. For example, when the slice level is made 0.6, the limit resolution is 50 nm (mask dimensions) at a standard deviation σ=30 nm and 70 nm at a standard deviation σ=50 nm. Whether the standard deviation σ should be made 30 nm or 50 nm is decided on a pre-process basis or by the fabricated device depending upon whether the linearity between the mask pattern and the resist pattern is important or on the critical resolution.

Figure 3:
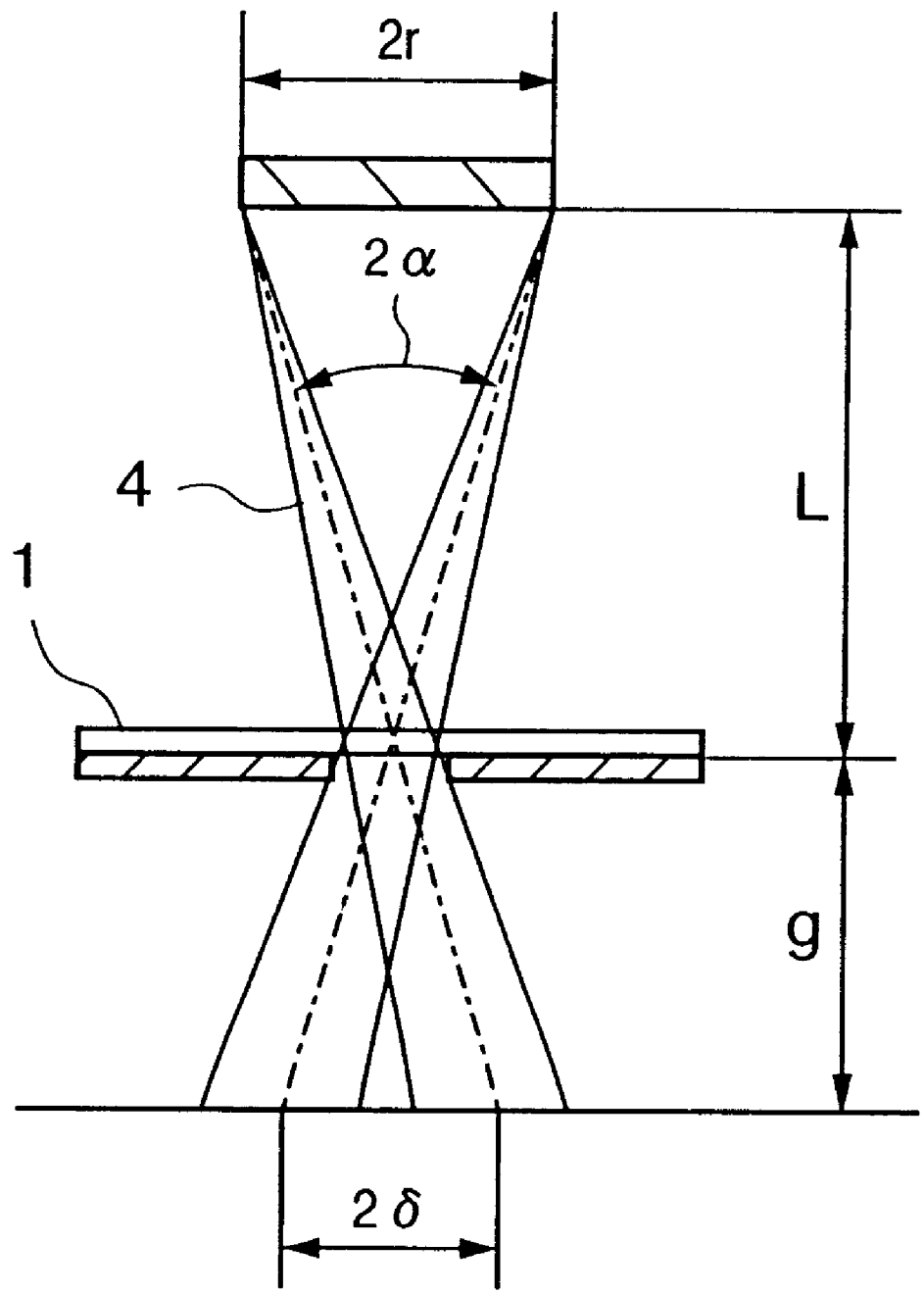
FIG. 3 is a diagram useful in describing the X-ray exposure apparatus according to the embodiment.

Physical convolution means will be described next. Described will be a method of convoluting an X-ray intensity distribution (the solid line in FIG. 4), which has been projected onto a wafer surface, utilizing the size of the light source, and obtaining an exposure intensity distribution indicated by the dotted line or dashed line in FIG. 4. As will be understood from FIG. 3, X-rays 4 that arrive at one point on a mask 1 from each point of a light source have a divergence angle 2α and do not travel on parallel paths. As a consequence, X-rays that have passed through a transparent portion in a mask pattern are not all transferred to the same position on the wafer but rather are transferred to positions displaced successively by 2δ. The length 2δ is expressed as follows, where 2r represents the size of the light source, L the distance between the light source and the mask and g the distance (proximity gap) between the mask and the wafer:

$$\delta = r \times g / L \qquad (1).$$

Figure 4:
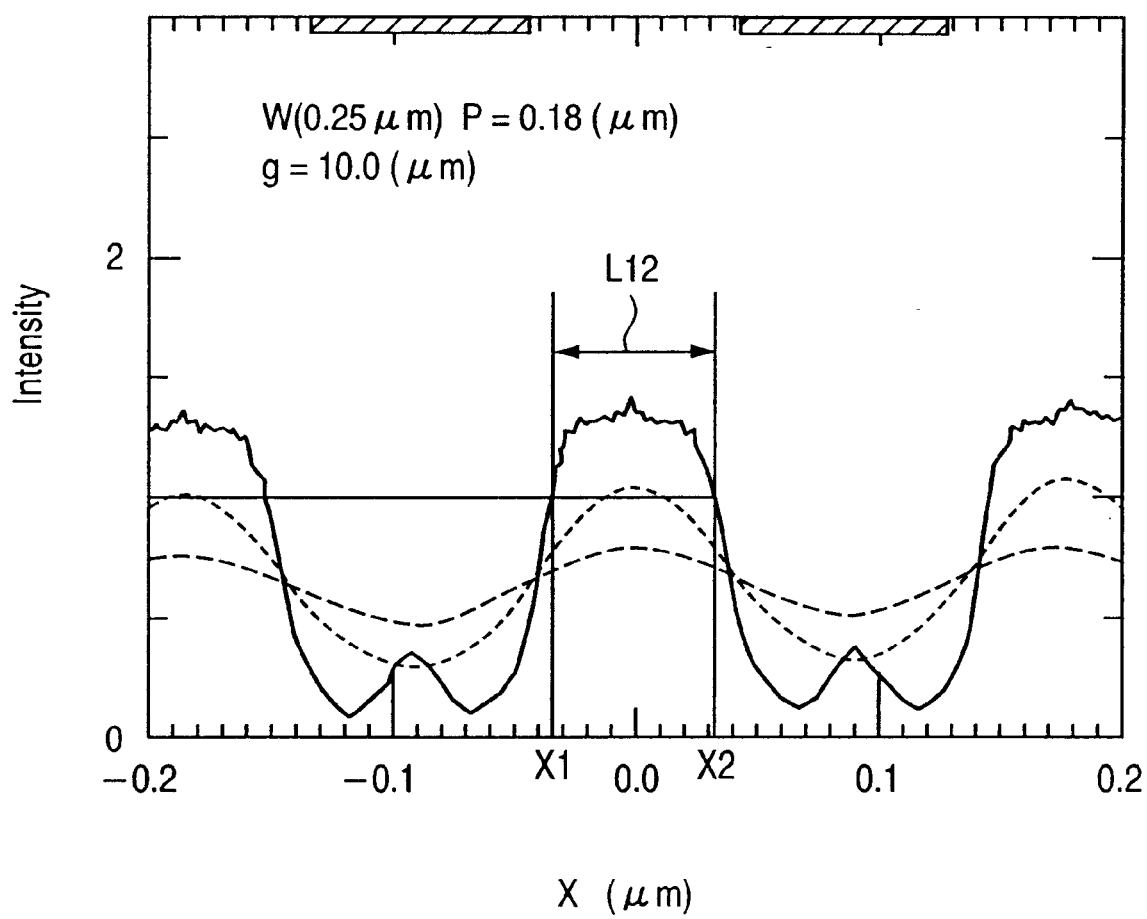
FIG. 4 is a diagram illustrating an example of an X-ray intensity distribution on a wafer surface, in which the distribution is produced by a mask pattern.
Figure 5:
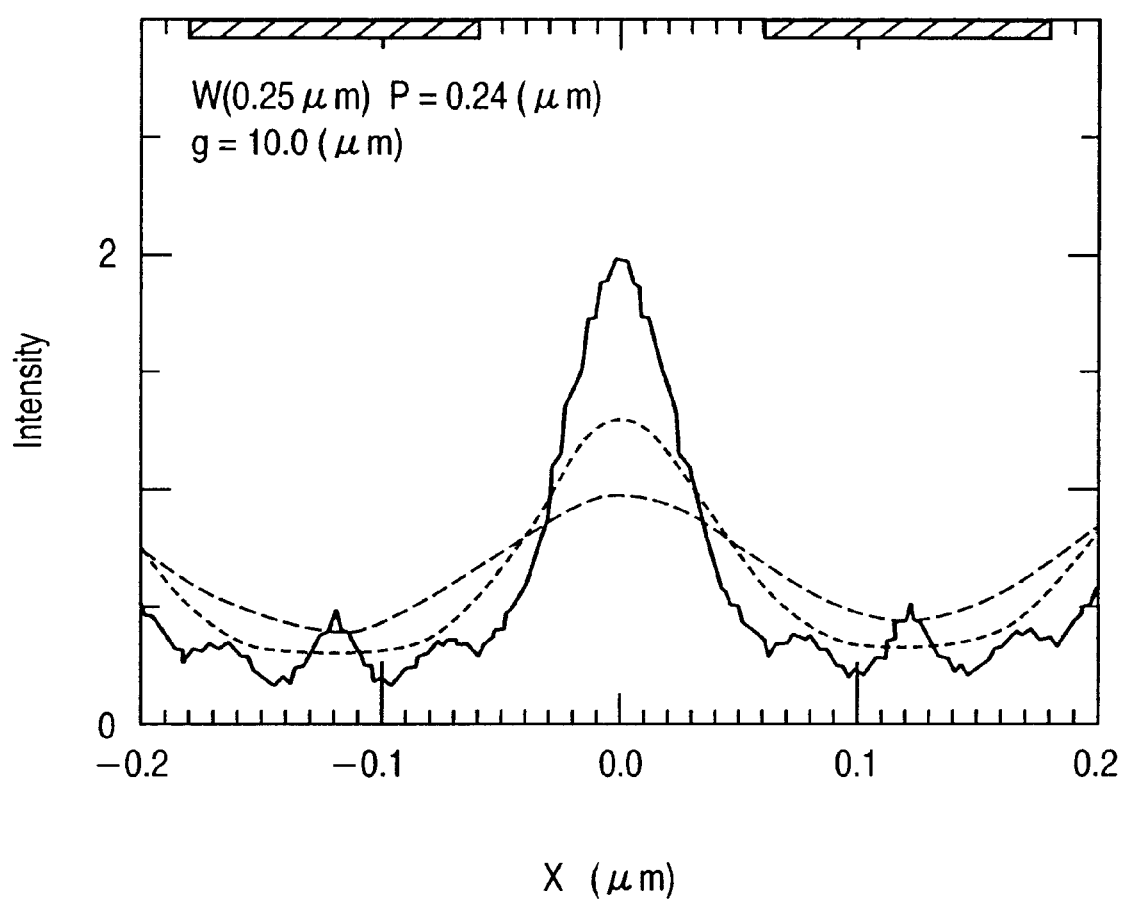
FIG. 5 is a diagram illustrating another example of an X-ray intensity distribution on a wafer surface, in which the distribution is produced by a mask pattern.
Figure 9:
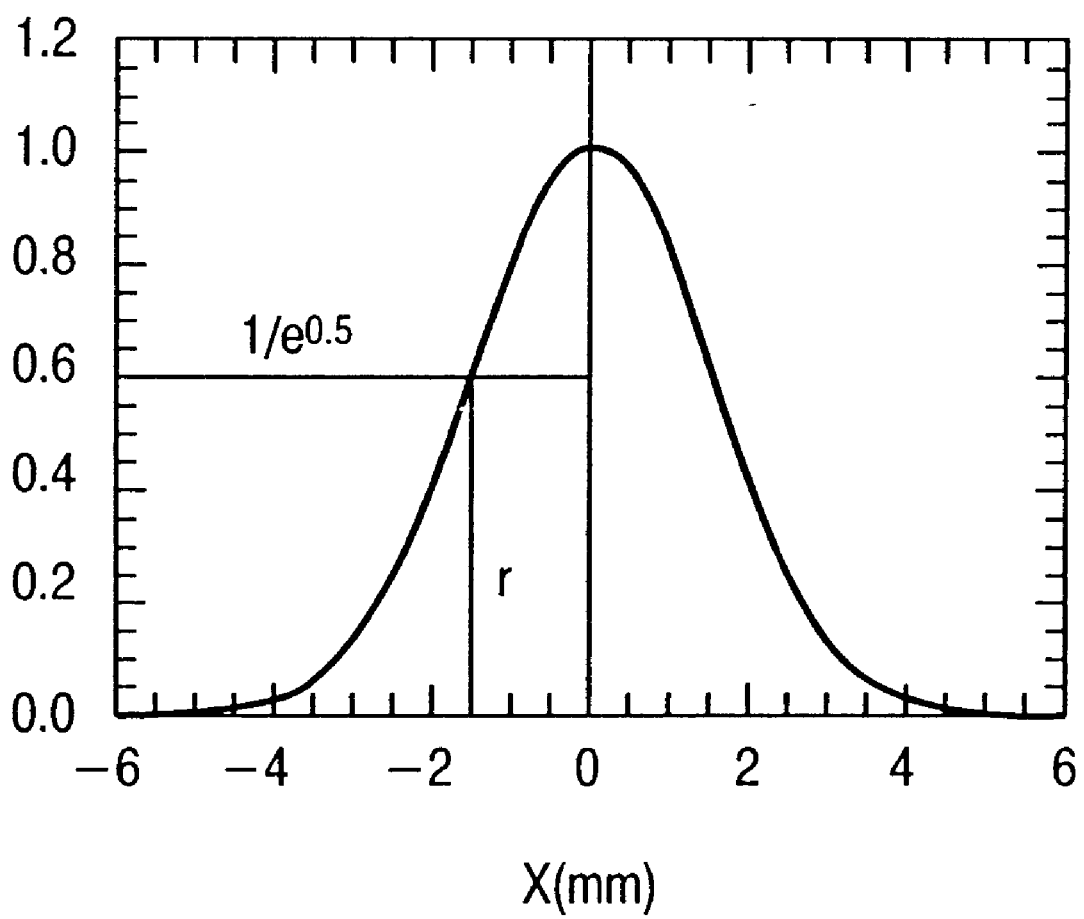
FIG. 9 is a diagram illustrating the luminance distribution of a radiation source having a Gaussian distribution.

Accordingly, in a case where the luminance distribution of the X-ray light source is a Gaussian distribution in an exposure system in which the proximity gap is 10 μm and the distance L between the light source and the mask is 500 mm, δ=30 nm will hold if r=1.5 mm holds, when the position at which the X-ray intensity is attenuated to a peak of exp(−½) is the size (standard deviation) r on one side of the light source. The luminance distribution of such an X-ray source is shown in FIG. 9. If exposure is performed by the X-ray source shown in FIG. 9, an exposure intensity distribution indicated by the dotted line in FIG. 4 is obtained. The relationships shown in FIG. 7 are obtained with linearity between the mask pattern and resist pattern. Furthermore, if r=2.5 mm holds, the standard deviation σ will be 50 nm and the exposure intensity distribution indicated by the dashed line in FIG. 4 is obtained. The relationship shown in FIG. 8 are obtained with linearity between the mask pattern and resist pattern.

Figure 10:
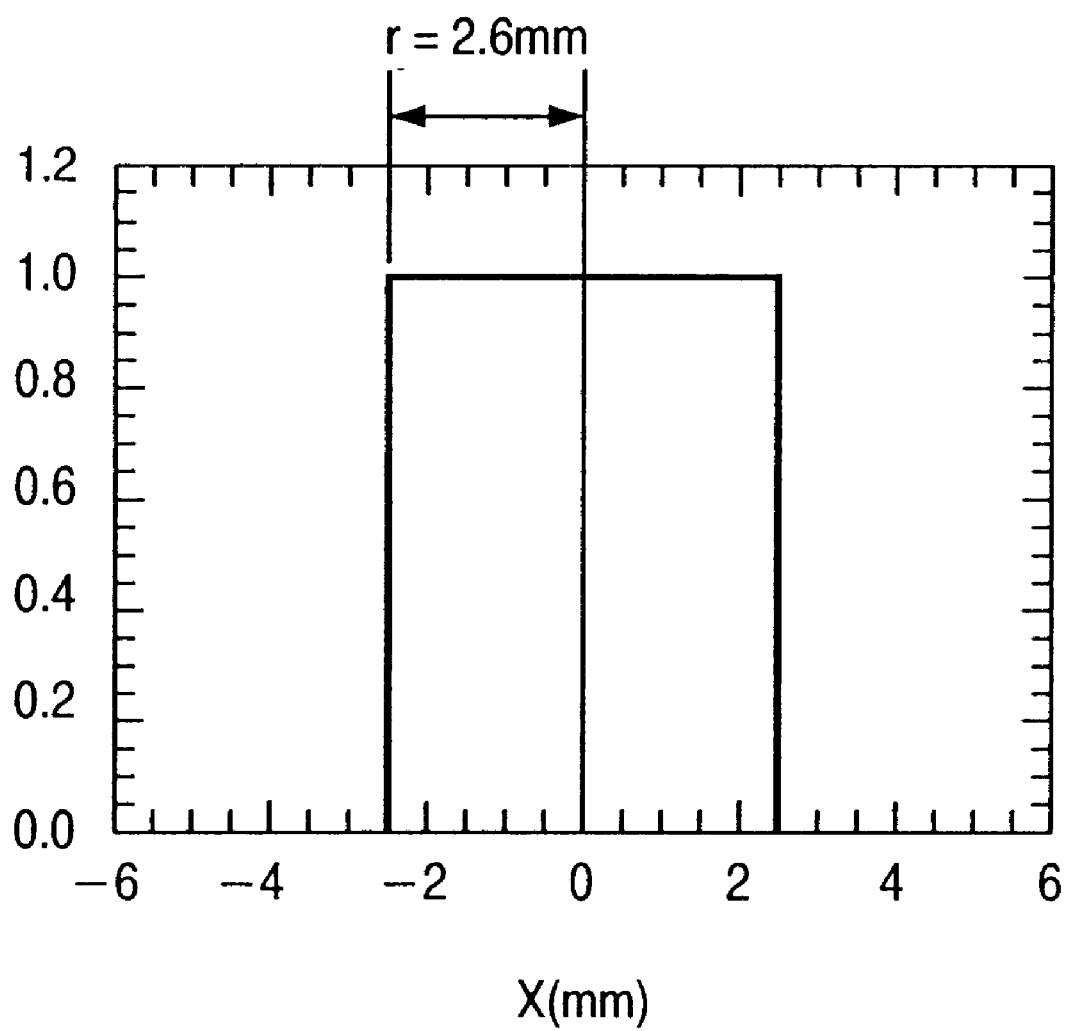
FIG. 10 is a diagram illustrating the luminance distribution of a radiation source having a uniform distribution.

Further, in a case when convolution is performed with a uniform distribution function, it will be understood that the width δ of the uniform distribution should be selected so that $\delta = \sqrt{3} \times \delta 0$ will hold in order to obtain results the same as achieved with a distribution (standard deviation δ0) obtained by convolution with a Gaussian distribution function. Accordingly, in order to obtain an exposure intensity distribution with defocusing δ of 30 nm in a case when the luminance distribution of the X-ray light source is a uniform distribution (i.e., in a case where the luminance is uniform), the size r of the light source should be selected to be 2.6 mm ($= \sqrt{3} \times 1.5$ mm), as shown in FIG. 10. The exposure intensity distribution obtained by exposure using the radiation source having the uniform luminance distribution shown in FIG. 10 and the exposure intensity distribution obtained by exposure using the radiation source of FIG. 9 in which the luminance distribution is Gaussian are equal.

Next, in the case of a lazer plasma radiation source, the radius of the generated plasma is on the order of 0.05 mm. Accordingly, δ=1 nm from Equation (1) and the exposure intensity distribution obtained is almost unchanged from the X-ray intensity distribution indicated by the solid line in FIG. 4. The linearity relationship between the mask pattern and the resist pattern is predicted to be as shown in FIG. 6 and transfer of the image is difficult.

Since the size of the generated plasma depends upon the spot diameter of the irradiating laser light source, the diameter of the plasma will increase if the spot diameter of the laser light source is enlarged. It is evident that a light source of the desired size may thus be obtained. If the spot diameter of the irradiating laser light is enlarged, however, the density of the plasma experiences a sudden decline and so does the intensity of the generated X-rays. This arrangement, therefore, is impractical.

A YAG laser for generating a plasma makes it possible to emit light at a repetition frequency of greater than 100 Hz. At the same time, it is necessary to generate a plasma of more than several hundred pulses in order to expose a resist. Accordingly, in a case where exposure is performed by carrying out laser irradiation a plurality of times during one exposure so that plasma X-rays are produced a plurality of times, an amount of defocusing can be introduced, without lowering the X-ray intensity, by moving the laser-irradiated position to obtain a desired shape for the radiation source without changing the spot diameter of the laser. The term "during one exposure" means performing exposure within the same angle of view without stepping the mask or wafer.

For example, in order to obtain an exposure intensity distribution with 30 nm of defocusing, the laser-irradiated zone should be irradiated to obtain an X-ray intensity of a normal distribution function of a standard deviation of 1.5 mm, or the laser-irradiated zone should be irradiated uniformly so as to obtain a circle having a radius of 2.6 mm.

Performing irradiation to obtain an X-ray intensity of a normal distribution function of a standard deviation of 1.5 mm does not mean changing the irradiation energy of the laser; it means performing irradiation by changing the irradiation density, as by raising the irradiation density of the laser at a position where the X-ray intensity is high. Furthermore, in a case of a light source of a normal distribution of a standard deviation 1.5 mm, it will suffice to take into consideration a spread having approximately twice this size. In other words, an X-ray source having a diameter on the order of 6 mm will suffice.

The optimum zone or range of plasma generating positions in proximity X-ray exposure will now be described in general terms. The maximum range of plasma generating positions requires that an amount Δ of defocusing be less than resolution line width Wr. A required condition, therefore, is that indicated by Equation (1) below.

$$\Delta < Wr \quad \text{(Eq. 1)}$$

Furthermore, ordinarily 10 nm is required as the minimum amount of defocusing. With a small amount of defocusing on the order of 10 nm, it becomes necessary to consider the amount of stage vibration and the spread of secondary electrons produced by absorption of X-rays in addition to the size of the plasma generating position. Accordingly, these three elements are evenly divided so that the amount Δ of defocusing due to the size of the plasma generating positions becomes 3 nm or more. The following Equation (2), therefore, holds true:

$$3 \text{ nm} < \Delta \quad \text{(Eq. 2)}$$

The following condition is obtained from Equations (1), (2) and the above-mentioned equation Δ=R×g/L:

$$3 \text{ nm} < R \times g/L < Wr$$

Since the size D (diameter) of the plasma generating position is equal to 2 R, we have the following:

$$6 \text{ nm} \times L/g < D < 2 \text{ } Wr \times L/g \quad \text{(Eq. 3)}$$

where L represents the distance between the radiation source and the mask, g the proximity gap and D the diameter of the plasma generating position.

In a case where plasma is generated by projecting the laser so as to obtain an X-ray intensity of a normal distribution function of the standard deviation r, i.e., so as to obtain X-rays having a certain luminance distribution, the size D of the plasma generating position is considered to be equal to 4 r and therefore Equation (4) below is obtained.

$$1.5 \text{ nm} \times L/g < r < 0.5 \times Wr \times L/g \quad \text{(Eq. 4)}$$

(First Embodiment)

Figure 16:
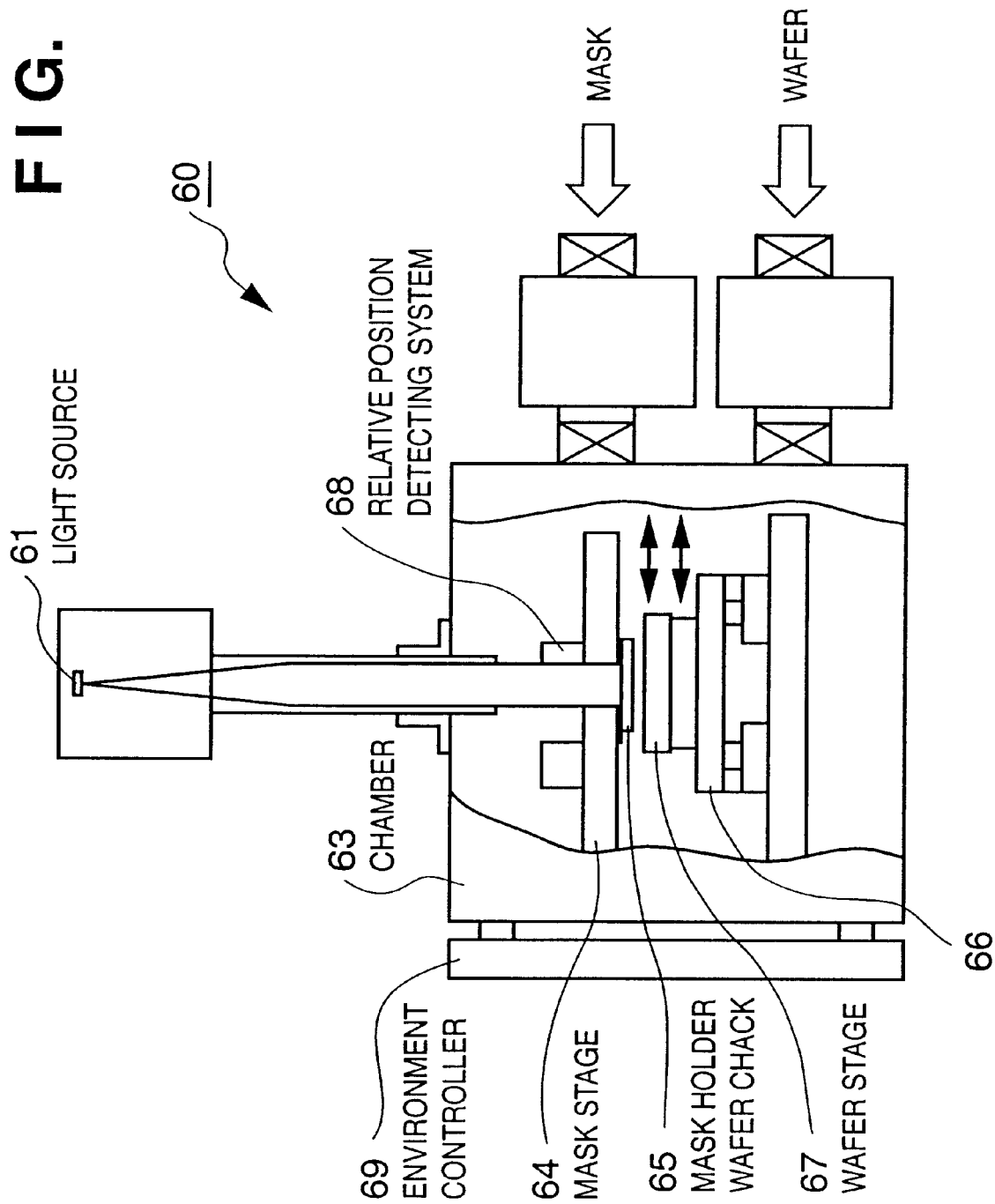
FIG. 16 is a structural view of the X-ray exposure apparatus according to the embodiments.

FIG. 16 shows an outline composition of the X-ray exposure apparatus 60 of the present embodiment. As shown in FIG. 16, the X-ray exposure apparatus 60 has a light system which includes X-ray light source 61. X-rays from the light system are supplied into a chamber 63 for exposing a wafer. Chamber 63 is provided with mask stage 64, mask holder 65, wafer stage 66, and wafer chuck 67. Mask holder 65 is a mechanism to maintain the mask in the stage of 64, and wafer chuck 67 is a mechanism to maintain the wafer in the wafer stage 66.

Relative position detection system 68 detects slippage of the relative position of the wafer and the mask. Wafer stage 66 is driven based on this detection result so as to perform the relative position alignment of the mask and the wafer, and the exposure will be done. This X-ray exposure apparatus has the transfer system, and the transfer system supplies the mask and the wafer into the chamber 63, and loads them in mask holder 65 and wafer chuck 67, respectively. In addition, environment controller 69 controls the atmosphere in chamber 63.

Figure 1A:
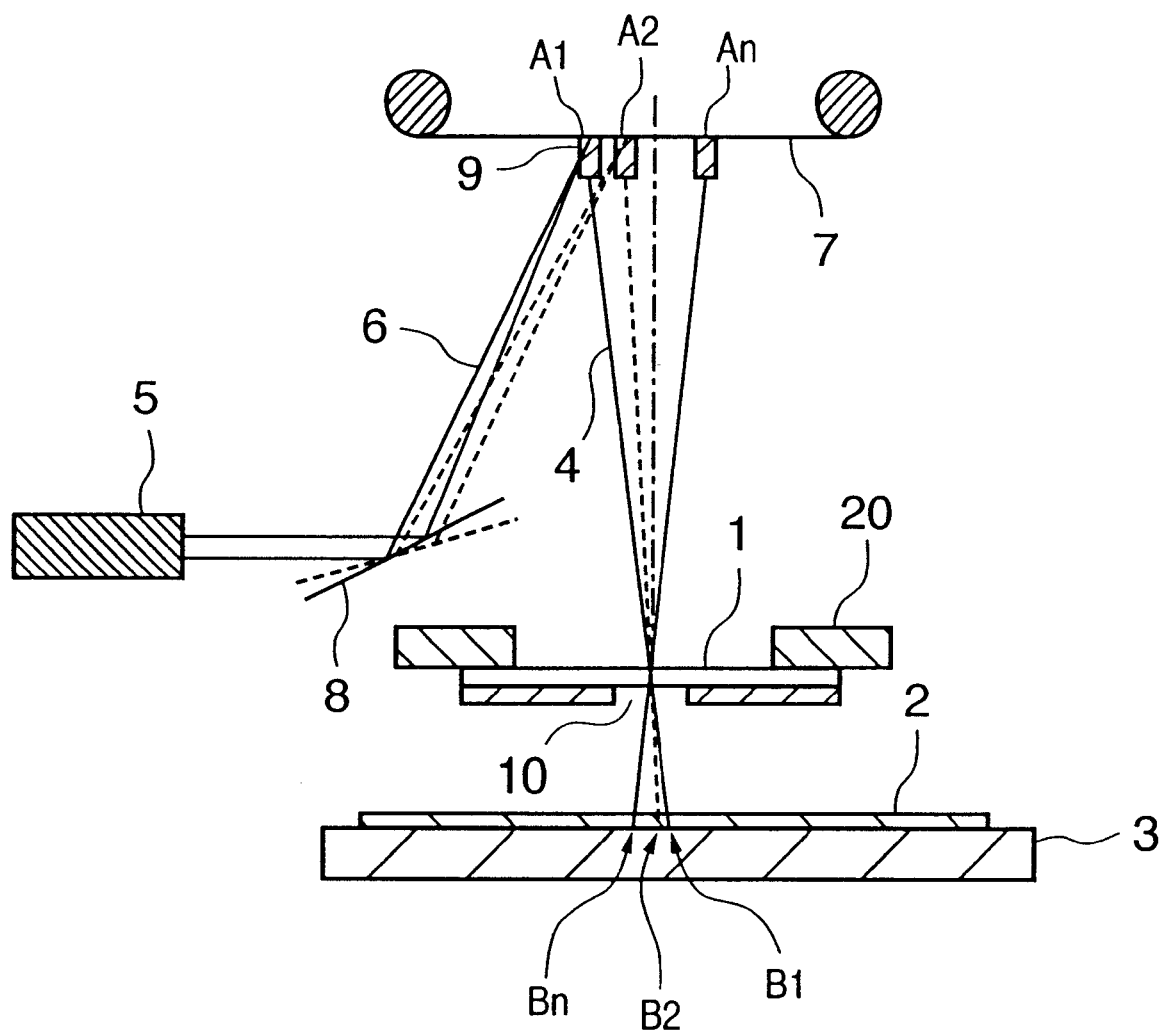
FIG. 1A is a structural view showing the principal components of an X-ray exposure apparatus according to a first embodiment.

FIG. 1A is a structural view showing the principal components of an X-ray exposure apparatus according to a first embodiment of the present invention. Shown in FIG. 1A are a mask 1 serving as a reticle, a wafer 2 serving as a substrate, a wafer stage 3, X-rays 4, a laser 5, a laser beam 6, copper tape 7 serving as a target, a mirror 8, plasma 9 and a transparent portion 10. The X-ray exposure apparatus according to this embodiment is constituted by the wafer stage 3, laser 5, target 7 and mirror 8, etc. The mirror is arranged so that its angle is changed by an actuator such as a piezo-electric device.

Figure 15:
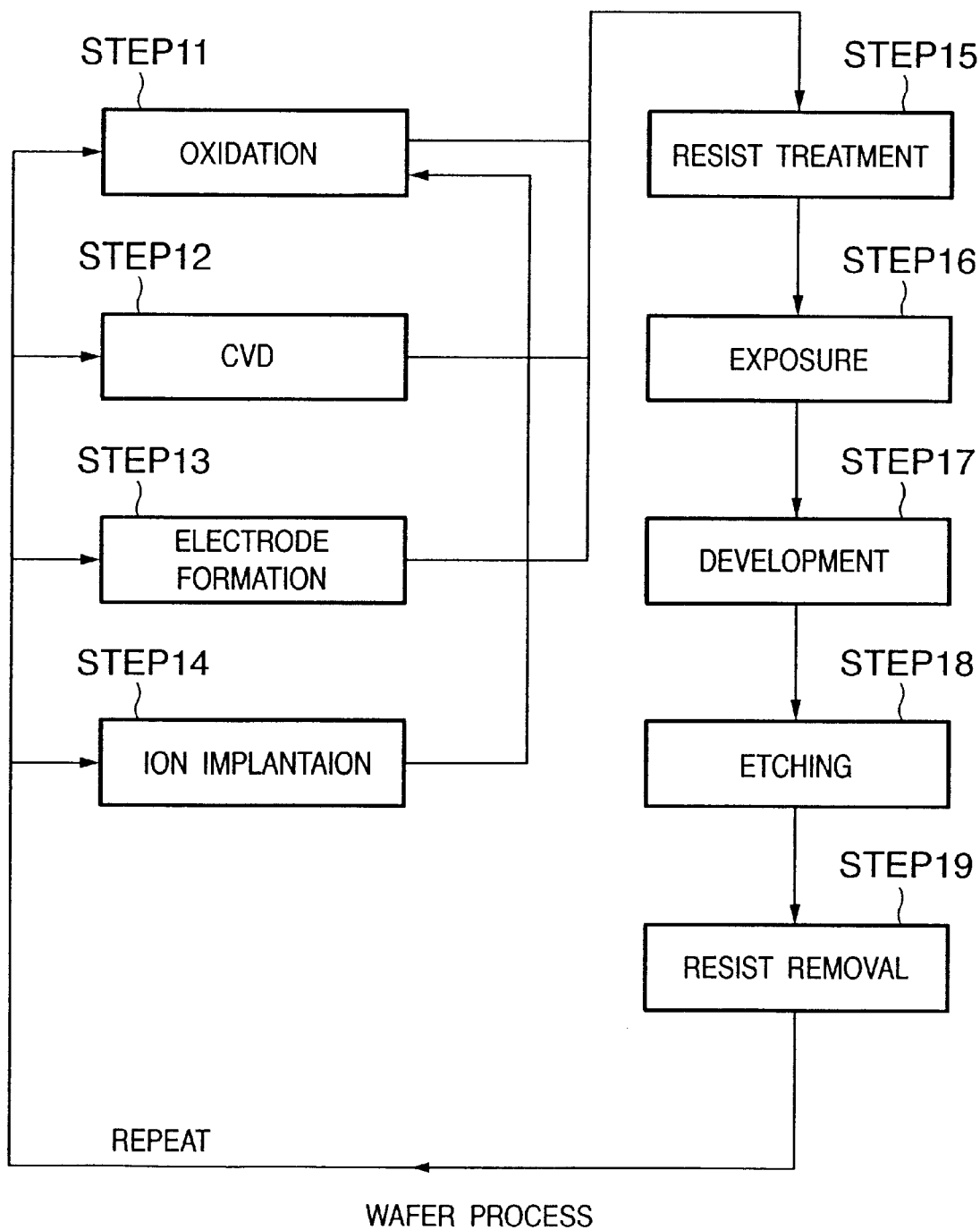
FIG. 15 is a diagram useful in describing a wafer process.

Note that the X-ray light source 61, the mask stage 64 and the wafer stage 65 of FIG. 15 correspond to the target 7, mask stage 20 and the wafer stage 3 of FIG. 1A, respectively.

The X-ray exposure apparatus thus constructed is operated as set forth below to perform exposure. The mask stage is moved so as to bring the mask 1 to a prescribed position relative to the wafer 2. Next, pulsed laser light 6 is emitted from the laser 5, which is a high-luminance pulsed laser such as a YAG laser, and the laser light is reflected by the mirror 8 so as to converge at a point A1 on the tape 7 serving as the target. The plasma 9 is produced at the position A1 on the surface of the tape 7. The plasma 9 is columnar in shape and has a diameter of 0.1 mm. The X-rays 4 are produced when excited atoms in the plasma recombine, the X-rays irradiate the mask 1 and X-rays 4 that have passed through the mask 1 irradiate the surface of the wafer. The X-ray intensity distribution at this time is one having peaks below the transparent portion 10 and elsewhere, as indicated by the solid line in FIG. 4. The X-rays 4 that have passed through the center of the transparent portion 10 irradiate a point B1 in FIG. 1A.

Next, the angle of the mirror 8 is shifted to converge light onto the tape 7. The position at which the light converges is now A2. As a result, a plasma is produced at position A2, which is offset from position A1 at which the plasma was produced the previous time, and X-rays are emitted. The X-rays 4 pass through the transparent portion 10 of the mask 1 and irradiate the surface of the wafer. The X-rays 4 that have passed through the center of the transparent portion 10 at this time irradiate a point B2 in FIG. 1A. The point B2 is offset from the position B1 previously irradiated by the X-rays 4 produced by the plasma.

By thus successively changing the angle of the mirror 8 to shift the position at which the plasma is generated, exposure is carried out while moving the position irradiated with the X-rays 4 that have passed through the transparent portion 10. When the plasma 9 has been produced N times and the positions at which the plasma 9 has been produced reaches An, exposure is terminated. The number of times the plasma 9 is produced, i.e., the number N of exposures, is decided in such a manner that the wafer 2 will be irradiated with the required amount of exposing light. Furthermore, the distance between A1 and An is decided from the required amount of defocusing.

For example, a case will be described in which the amount of defocusing necessary is just 30 nm at the standard deviation of the normal distribution, the distance between the mask 1 and the position at which the plasma 9 is generated, which is the X-ray source position, is 500 mm and the distance between the mask 1 and the wafer 2 is 10 μm. In a case where the X-ray light source is expressed by a uniform luminance distribution under these conditions, the distance between A1 and An should be made 5.2 mm and the mirror 8 should be rotated so as to generate the plasma 9 at equal intervals between A1 and An. Further, in a case where the luminance distribution of the X-ray light source is expressed by a normal distribution, the distance between A1 and Δn should be made 6 mm and it should be so arranged that the positions at which the plasma 9 is generated and the relative frequency become the distribution shown in FIG. 9. Of course, an arrangement may be adopted in which the angle of rotation of the mirror 8 is adjusted to obtain another luminance distribution.

After exposure is thus performed in one angle of view, the wafer stage 3 is stepped and exposure is performed in the next angle of view.

In a case where, depending upon the process, the line width of the mask pattern to be exposed is not that small but linearity is required with respect to the line width of the resist pattern that has been burned in, it is better to perform exposure in such a manner that an exposure distribution pattern will be obtained where the amount of defocusing is other than a standard deviation σ of 30 nm, e.g., 50 nm. This is as set forth earlier. In order that an alignment error will not occur between exposure where the amount of defocusing is the standard deviation σ of 30 nm and exposure where the amount of defocusing is the standard deviation σ of 50 nm in such a case, the laser 5 and mirror 8 are adjusted in such a manner that the center positions of the two radiation sources will coincide.

For the sake of simplicity, a case in which a one-dimensional mask pattern is transferred by a one-dimensional X-ray source has been described as an example. However, an actual pattern is two-dimensional and therefore it is desirable for the luminance distribution of an X-ray source in a direction perpendicular to the plane of the drawing to be made a distribution similar to the luminance distribution that is parallel to the plane of the drawing.

Figure 1B:
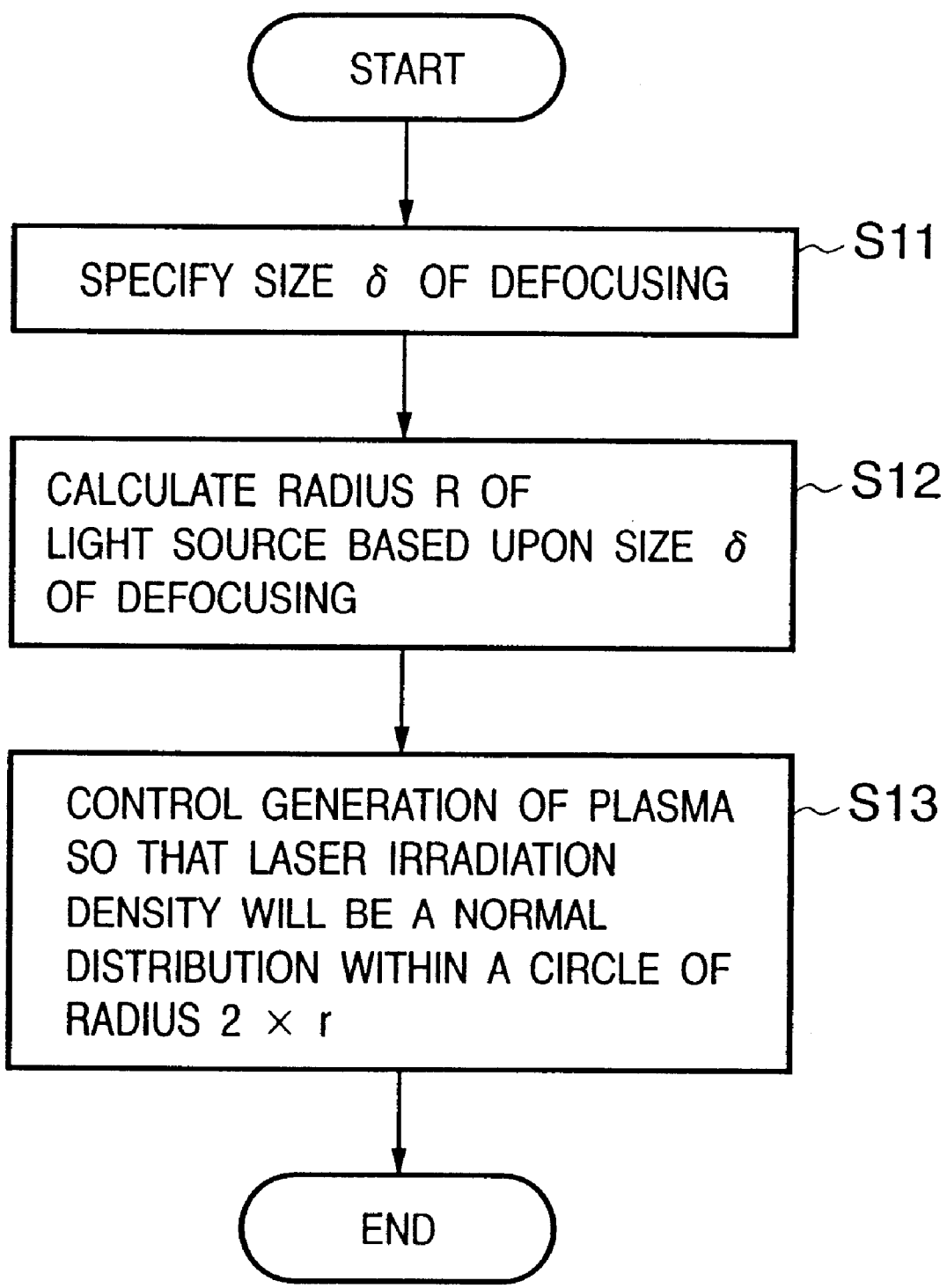
FIG. 1B is a flowchart useful in describing a procedure for controlling the X-ray exposure apparatus of the first embodiment.

FIG. 1B is a flowchart useful in describing processing for generating X-rays in a case where exposure processing is executed with the luminance distribution of the X-ray source being made a normal distribution. The processing described below is implemented by executing a predetermined control program using a CPU that exercises control of the X-ray exposure apparatus.

First, at step S11, the size δ of defocusing is entered from a console (not shown) or the like, whereupon the radius r of the light source is calculated at step S12. The radius r of the light source is obtained by the following equation:

$$r = \delta L / g$$

(where L represents the distance between the light source and the mask and g the proximity gap).

Next, at step S13, a circle the radius of which is twice the value of r obtained at step S12 is adopted as a laser irradiation area for X-ray generation, laser irradiation is performed in such a manner that the laser irradiation density will be a normal distribution within the laser irradiation area, and X-rays are generated.

Figure 1C:
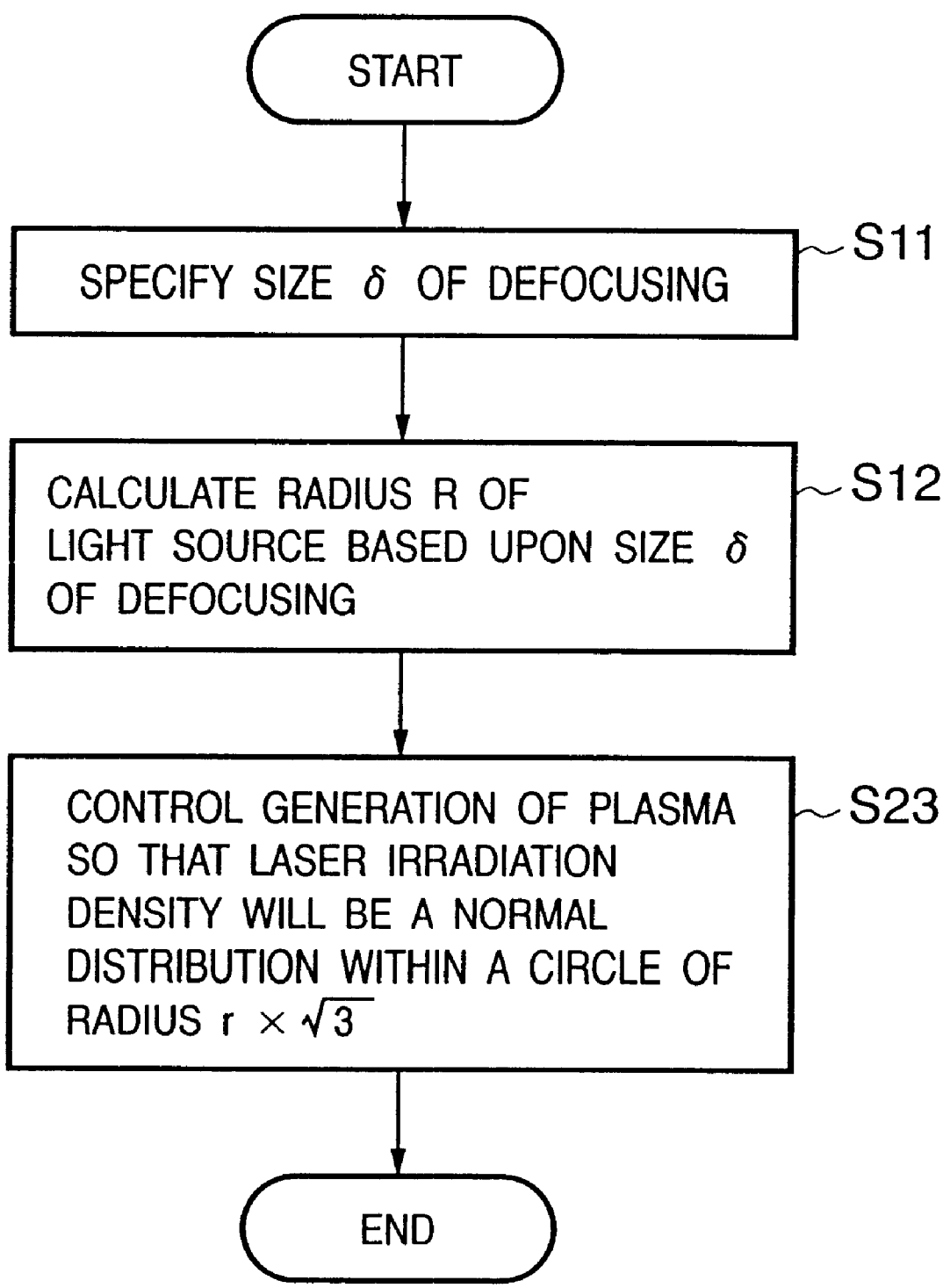
FIG. 1C is a flowchart useful in describing a procedure for controlling the X-ray exposure apparatus of the first embodiment.

In a case where the laser irradiation density within the laser irradiation area is made uniform, it will suffice to exercise control illustrated by the flowchart shown in FIG. 1C. Specifically at step S23, a circle of the radius of which is $\sqrt{3}$, times the value of r obtained at step S12 is adopted as a laser irradiation area, and laser irradiation is performed in such a manner that the laser irradiation density will be uniform within the laser irradiation area.

By the thus generated X-ray light source, a wafer can be irradiated with X-rays having a desired amount of defocusing.

(Second Embodiment)

Figure 2:
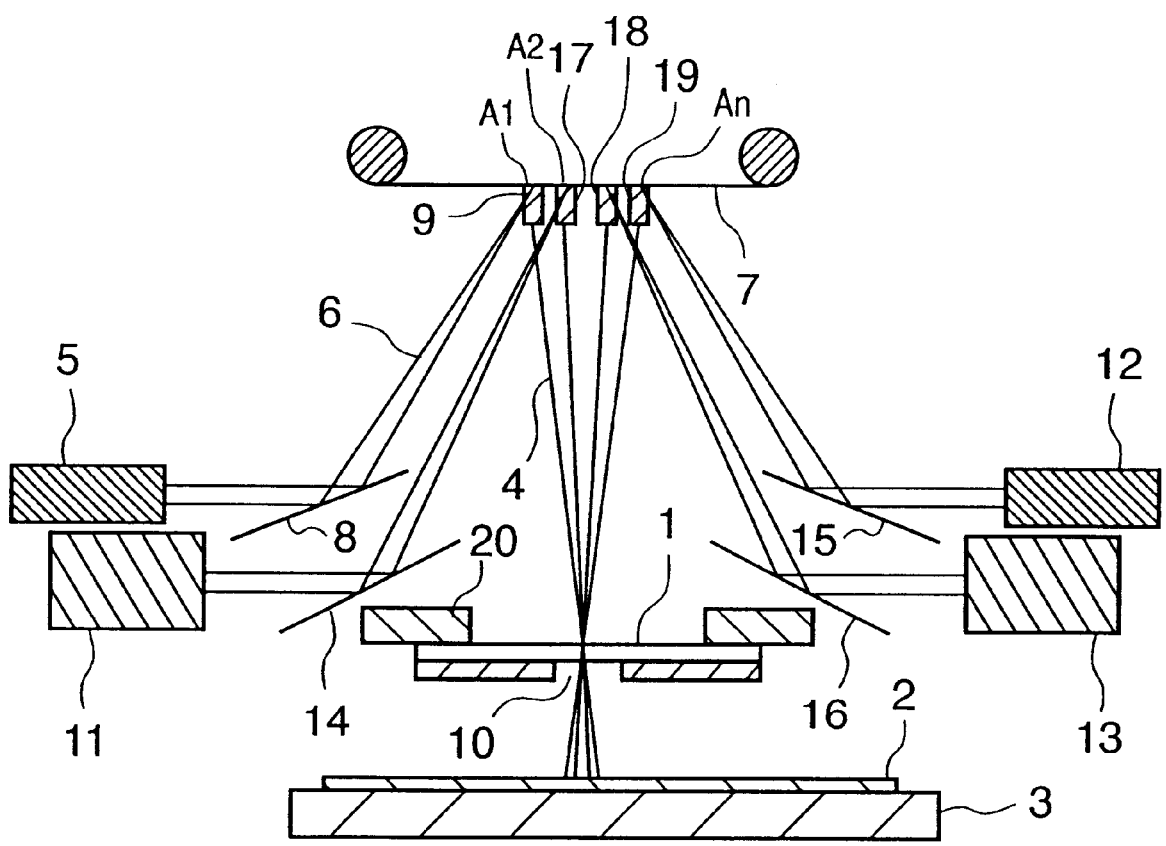
FIG. 2 is a structural view showing the principal components of an X-ray exposure apparatus according to a second embodiment.

FIG. 2 is a structural view showing the principal components of an X-ray exposure apparatus according to a second embodiment of the present invention. Shown in FIG. 1 are the mask 1 serving as the reticle, the wafer 2 serving as the substrate, the wafer stage 3, the X-rays 4, the laser 5, the laser beam 6, the copper tape 7 serving as the target, the mirror 8, the plasma 9 and the transparent portion 10. Also shown are lasers 11, 12 and 13, mirrors 14, 15 and 16 and plasmas 17, 18 and 19. The X-ray exposure apparatus according to this embodiment includes the plurality of lasers 5, 11, 12, 13 for irradiating different positions on the target 7, and the plurality of mirrors 8, 14, 15, 16.

The operation of the X-ray exposure apparatus according to this embodiment will now be described. This embodiment is an example of an arrangement in which plasmas are produced at a plurality of points using a plurality of YAG lasers. The laser beams generated by the plurality of lasers 5, 11, 12, 13 are adjusted by the corresponding mirrors 8, 14, 15, 16, respectively, so as to be focused on different positions of the target 7. An X-ray generating source of a prescribed size is produced by the total of the laser beams. The substantial size of the X-ray generating source can also be changed by performing control so as to turn the irradiation by each laser beam ON and OFF independently. The X-ray exposure apparatus according to this embodiment is advantageous in that reliability is enhanced and the structure simplified. The reason for this is that the position at which the plasma 9 is generated is not moved by moving the mirror 8 as in the X-ray exposure apparatus of the first embodiment, and it is unnecessary to move the mirrors 8, 14, 15, 16.

Further, with a laser plasma radiation source in which the angle of the laser light is changed using an optical fiber, the position at which the plasma is generated may be changed by altering the angle of the optical fiber to change the position irradiated by the laser.

An X-ray exposure apparatus using a laser plasma X-ray source for generating plasma by relying upon a laser as the plasma X-ray source has been described. The present invention is applicable also to a gas plasma X-ray source in which a plasma is produced by using an electrical discharge. In such a case, an external electrical field would be applied in addition to the original electric field to move the position at which the plasma is generated.

(Third Embodiment)

Figure 17:
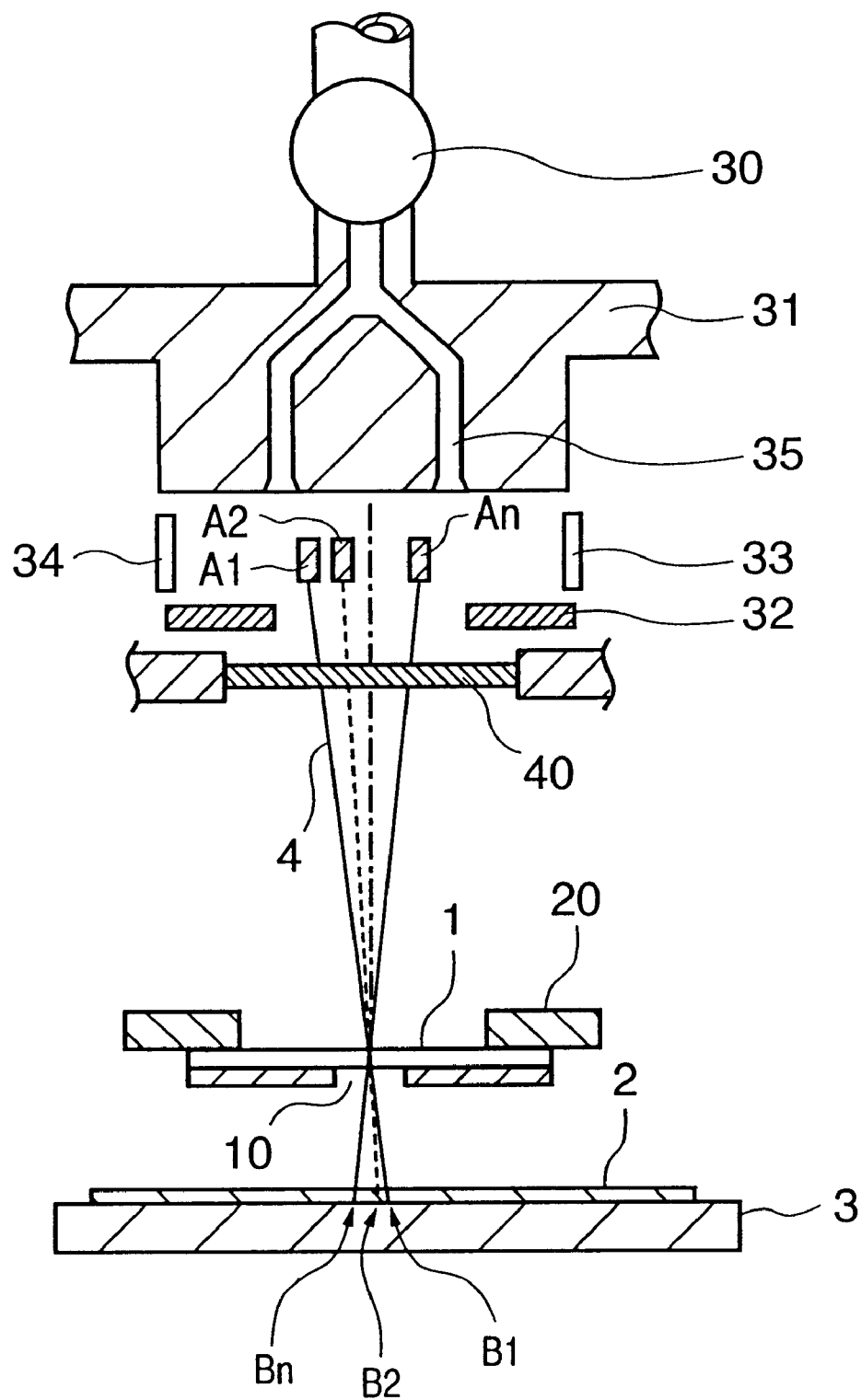
FIG. 17 is a diagram illustrating another example of a plasma X-ray source.

FIG. 17 illustrates an example in which the present invention is applied to an exposure apparatus that employs a plasma X-ray source.

This embodiment will be described in regard to a case where use is made of a Z-pinch X-ray source, which is a plasma X-ray source.

The operation of the present invention will now be described in conjunction with FIG. 16, which illustrates the basic structure of the invention.

<Description of Components>

The apparatus includes a high-speed valve 30 which, when opened, introduces a gas into a gas introduction passageway 35. An electrical discharge is produced by impressing a voltage across a pair of opposing electrodes 31 and 32. The position at which the plasma is produced is moved by a magnetic field generated at magnetic poles 33, 34. An X-ray window made of beryllium separates a mask/wafer exposure chamber having a helium atmosphere from the vacuum environment of the X-ray source.

<Operation>

First, the high-speed valve 30 is opened to introduce the gas between the pair of electrodes 31, 32, which are placed in a vacuum environment in advance. The gas passes through the passageway 35 and forms a cylindrical gaseous mass between the electrodes 31 and 32. If a pulsed voltage is impressed across the electrodes 31 and 32 at this time, a current will flow through the gas. A plasma in which current flows through the gas is produced and, at the same time, a magnetic field produced by the current subjects the plasma to a force directed toward the center of the electrodes, whereby the plasma is caused to contract. If, in addition to the magnetic field produced by the current, a magnetic field is applied across the poles 33, 34, the position at which the plasma is produced will shift from the center position.

The position at which the plasma is produced can be moved to A1, A2, ..., An, depending upon the strength of the magnetic field. It will suffice if this movement of the plasma generating position takes place during one exposure operation, as already mentioned. Accordingly, if plasma is produced a plurality of times by a plurality of electrical discharges, as in the manner of an ordinary plasma radiation source, and a single exposure is performed, it will not be necessary to vary the magnetic field while the plasma is in the process of being generated; it will suffice to change the field whenever the plasma is produced.

In the example described above, a magnetic field is used to move the position of the plasma. However, an electric field may be used for this purpose. Alternatively, the position at which the plasma is generated may be changed by changing the position of the electrodes mechanically. In this case, the entire X-ray source may be moved or one electrode may be moved or oscillated.

Further, the plasma X-ray source is not limited to the above-mentioned Z-pinch X-ray source, and the present invention can be applied to many other plasma X-ray sources as well.

By way of example, a coaxial-type plasma X-ray source of the kind shown in FIG. 18 is illustrated in SPIE VOL. 316 (1981) p.196. In this apparatus, an inner electrode 41 and an outer electrode 42 have a coaxial structure. When a pulsed voltage is applied across these electrodes, a sheet-like plasma moves to C1, C2, C3 and C4 owing to the interaction of electric and magnetic fields, the plasma is pinched at position D and high-intensity X-rays 4 are produced. The position at which the plasma is produced can be moved by externally applying a magnetic or electric field, as in the foregoing embodiment, or by oscillating the radiation source.

(Fourth Embodiment)
(Embodiment of Semiconductor Production System)

Described next will be an example of a system for producing semiconductor devices (semiconductor chips such as IC and LSI chips, liquid crystal panels, CCDs, thin-film magnetic heads and micromachines, etc.) using the X-ray exposure apparatus according to the present invention. This system utilizes a computer network outside the semiconductor manufacturing plant to provide troubleshooting and regular maintenance of manufacturing equipment installed at the manufacturing plant and to furnish maintenance service such as the provision of software.

Figure 11:
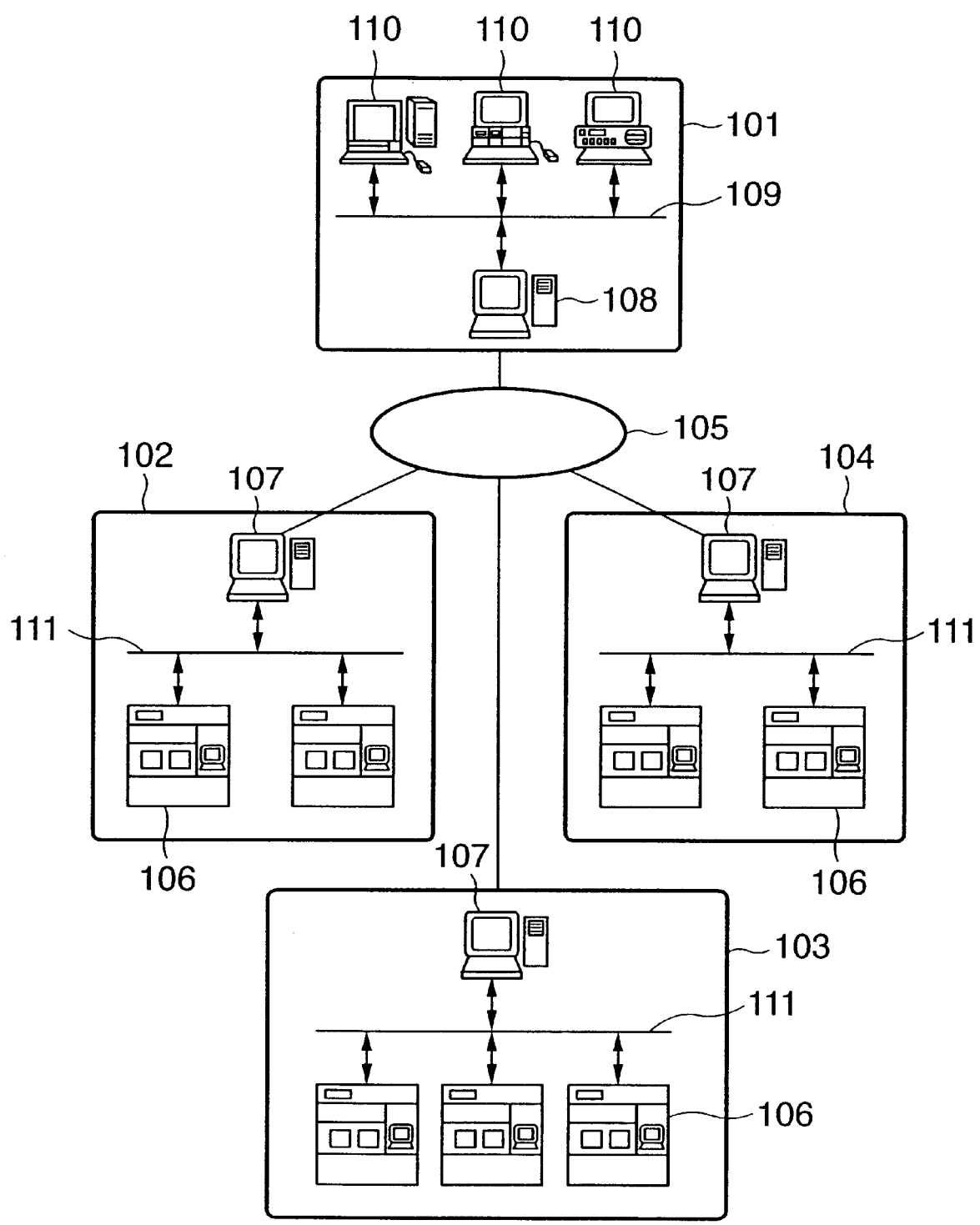
FIG. 11 is a conceptual view showing a semiconductor device production system that uses an X-ray exposure apparatus according to the present invention, wherein the system is as seen from a certain angle.

FIG. 11 illustrates the overall system as seen from a certain angle. The system includes the business office 101 of the vendor (equipment supplier) that provides the equipment for manufacturing semiconductor devices. Semiconductor manufacturing equipment for various processes used in a semiconductor manufacturing plant is assumed to be the manufacturing equipment. Examples of the equipment are pre-treatment equipment (lithographic equipment such as exposure equipment, resist treatment equipment and etching equipment, heat treatment equipment, thin-film equipment and smoothing equipment, etc.) and post-treatment equipment (assembly equipment and inspection equipment, etc.). The business office 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111 which connects these pieces of equipment to construct an intranet, and a host management system 107 serving as a monitoring unit for monitoring the status of operation of each piece of manufacturing equipment 106.

The host management system 107 provided at each of the plants 102 to 104 has a gateway for connecting the LAN 111 in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited.

More specifically, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side.

A communication protocol (TCP/IP), which is used generally over the Internet, can be employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 12:
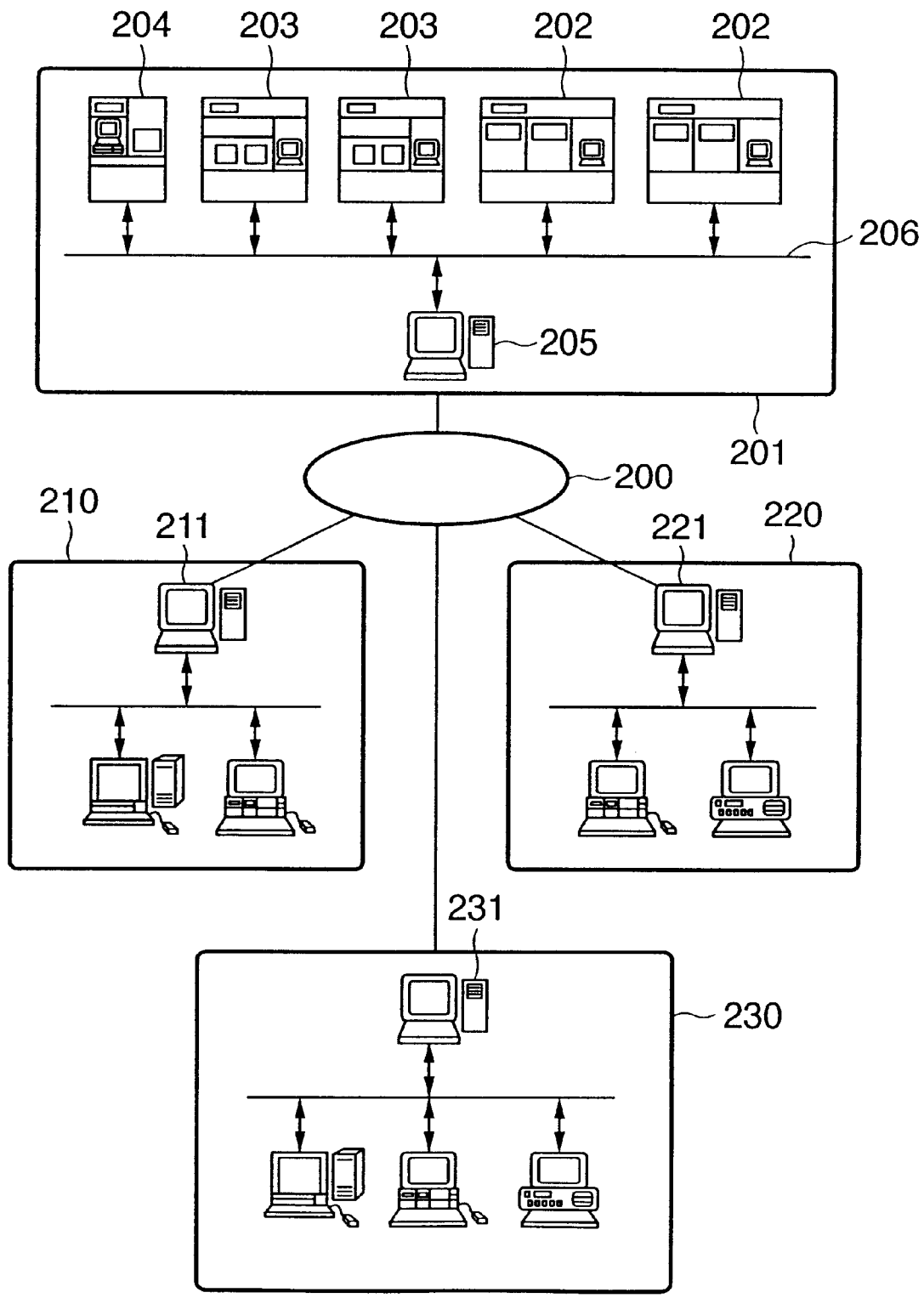
FIG. 12 is a conceptual view showing a semiconductor device production system that uses an X-ray exposure apparatus according to the present invention, wherein the system is as seen from another angle.

FIG. 12 is a conceptual view illustrating the overall system of this embodiment as seen from an angle different from that depicted in FIG. 11. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the example of FIG. 15, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication.

This system includes a manufacturing plant 201 of the user of manufacturing equipment (the maker of semiconductor devices). The manufacturing line of this plant includes manufacturing equipment for implementing a variety of processes. Examples of such equipment are exposure equipment 202, resist treatment equipment 203 and thin-film treatment equipment 204. Though only one manufacturing plant 201 is shown in FIG. 15, in actuality a plurality of these plants are networked in the same manner. The pieces of equipment in the plant are interconnected by a LAN 206 to construct an intranet and the operation of the manufacturing line is managed by a host management system 205.

The business offices of vendors (equipment suppliers) such as an exposure equipment maker 210, resist treatment equipment maker 220 and thin-film treatment equipment maker 230 have host management systems 211, 221, 231, respectively, for remote maintenance of the equipment they have supplied. These have maintenance databases and gateways to the outside network, as described earlier. The host management system 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each piece of manufacturing equipment installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 13, on the display. The operator managing the manufacturing equipment at each plant enters information at the input items on the screen while observing the screen. The information includes model 401 of the manufacturing equipment, its serial number 402, subject matter 403 of the problem, its date of occurrence 404, degree of urgency 405, the particular condition 406, countermeasure method 407 and progress report 408. The entered information is transmitted to the maintenance database via the Internet. The appropriate maintenance information is sent back from the maintenance database and is presented on the display screen.

The user interface provided by the Web browser implements hyperlink functions 410 to 412 as illustrated and enables the operator to access more detailed information for each item, to extract the latest version of software, which is used for the manufacturing equipment, from a software library provided by the vender, and to acquire an operating guide (help information) for reference by the plant operator. Here the maintenance information provided by the maintenance database also includes the above-described information relating to the present invention, and the software library also provides the latest software for implementing the present invention.

A process for manufacturing a semiconductor device utilizing the production system set forth above will now be described.

Figure 14:
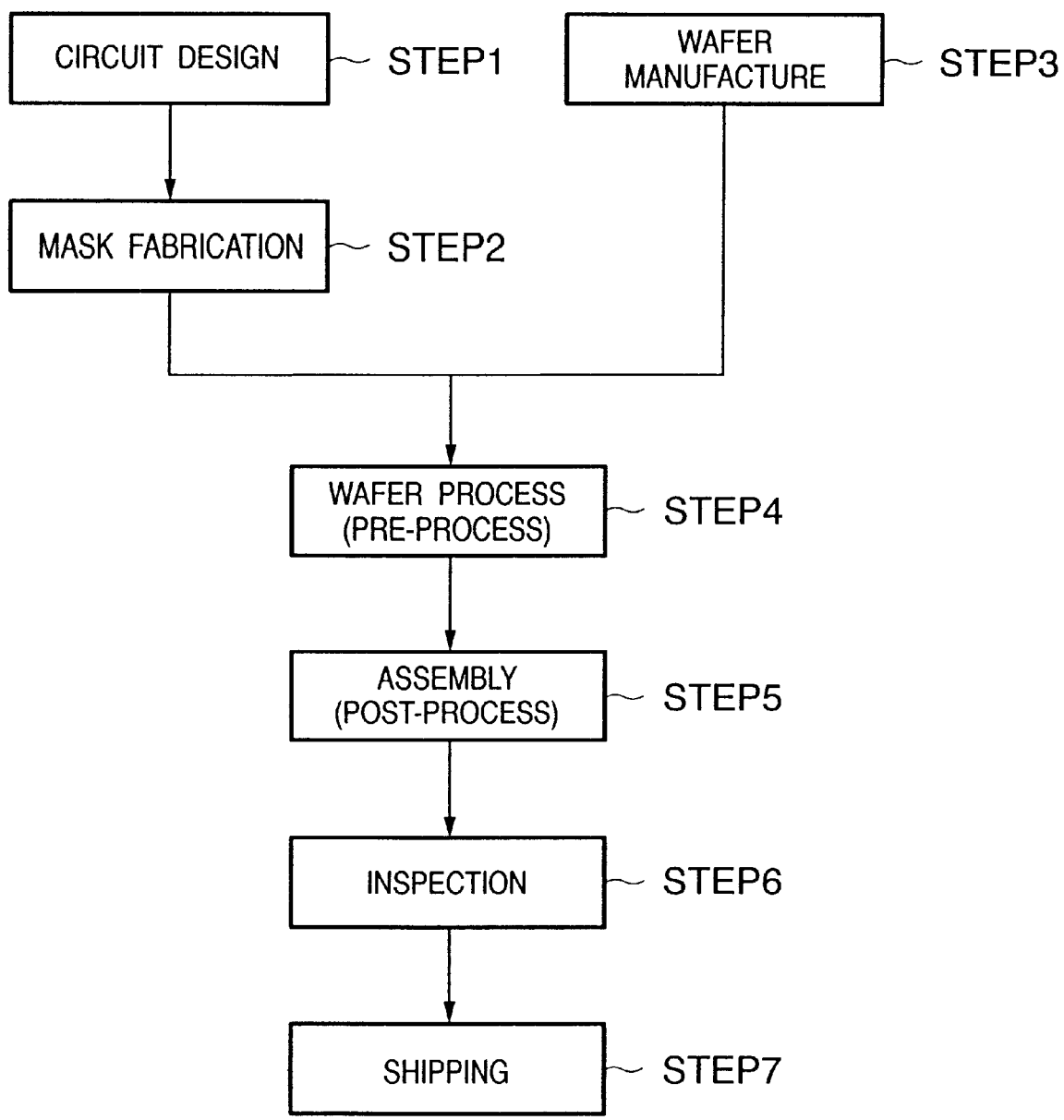
FIG. 14 is a diagram useful in describing the flow of a device manufacturing process.

FIG. 14 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture).

The actual circuit is formed on the wafer by lithography, using the mask and wafer that have been prepared, at step 4 (wafer process), which is also referred to as "pre-treatment". A semiconductor chip is obtained using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7).

The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

FIG. 15 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal).

Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, defocusing on a resist, which is an important process factor, can be changed by generating plasmas at a plurality of positions during proximity exposure. As a result, the width of a resist pattern can be enlarged reliably along with an increase in the size of the mask pattern, controllable parameters are increased and a more suitable resist pattern can be obtained. The end result is that process tolerance in terms of exposing finer patterns is improved.

As many apparently widely different embodiments of the present invention can be made without departing from the spirit and scope thereof, it is to be understood that the invention is not limited to the specific embodiments thereof except as defined in the appended claims.

What is claimed is:

1. A proximity X-ray exposure apparatus for irradiating a reticle with X-rays generated from an X-ray source and irradiating a substrate with X-rays that have passed through the reticle, said apparatus comprising:

a plasma X-ray source for generating X-rays by producing plasma; and control means for controlling X-ray intensity distribution by controlling production of the plasma so that the plasma is produced at a plurality of positions in one irradiating operation of the substrate with the X-rays, wherein said control means controls the X-ray intensity distribution in order to control the plurality of positions so that a required amount of defocusing, which is a size of a projection image corresponding to one point on the reticle formed by irradiating the reticle with X-rays generated at the plurality of positions, can be obtained.

2. The apparatus according to claim 1, further comprising:

a target for functioning as the X-ray source by generating X-rays in response to being irradiated with laser light, wherein said control means controls operation for irradiating with laser light a plurality of locations within a laser-light irradiation area on said target that has been decided based upon the amount of defocusing of X-rays, the defocusing amount representing a stage of X-ray intensity distribution and being decided based upon importance of critical resolution and linearity between the mask pattern and the resist pattern.

3. The apparatus according to claim 2, wherein the irradiation area is decided based upon a value r obtained from $$\delta \times L/g$$

where δ represents the amount of defocusing which represents a standard deviation of the X-ray intensity distribution, L the distance between said target and the reticle, and g the distance between the reticle and the substrate.

4. The apparatus according to claim 3, wherein the irradiation area is decided to be an area having a radius of 2r, and said control means controls operation for irradiating the irradiation area on said target with laser light in such a manner that irradiation density becomes a normal distribution having a standard deviation r which satisfies the following inequality, $$1.5 \text{ nm} \times L/g < r < 0.5 \times Wr \times L/g$$

where L represents the distance between the X-ray source and the reticle, g the distance between the reticle and the wafer, and Wr the least line width.

5. The apparatus according to claim 3, wherein the irradiation area is decided to be an area having a radius of $r \times \sqrt{3}$, and said control means controls operation for irradiating the irradiation area on said target with laser light in such a manner that irradiation density becomes uniform, the irradiation area has a diameter D which satisfies the following inequality, $$6 \text{ nm} \times L/g < D < 2 \times Wr \times L/g$$

where L represents the distance between the X-ray source and the reticle, g the distance between the reticle and the wafer, and Wr the least line width.

6. The apparatus according to claim 2, further comprising setting means for setting the amount of defocusing.

7. The apparatus according to claim 2, wherein said target generates X-rays by producing plasma in response to being irradiated with laser light.

8. The apparatus according to claim 2, wherein said X-ray source has a mirror for reflecting the laser light in order that the laser light will arrive at said target, and said control means controls operation for irradiating with laser light a plurality of locations within the irradiation area on said target by changing the angle of said mirror during a single exposure operation.

9. The apparatus according to claim 2, wherein the X-ray source has a plurality of laser light sources for generating a plurality of laser beams for irradiating respective ones of different positions on said target, and said control means controls operation for irradiating with laser light a plurality of locations within the irradiation area on said target by using a plurality of laser beams from said plurality of laser light sources during a single exposure operation.

10. The apparatus according to claim 1, wherein said plasma X-ray source produces plasma by applying pulse voltages between electrodes.

11. The apparatus according to claim 10, wherein the plasma is moved by a magnetic field.

12. The apparatus according to claim 10, wherein the plasma is moved by an electric field.

13. The apparatus according to claim 10, wherein the plasma is moved by moving the electrodes.

14. The apparatus according to claim 1, further comprising a display, a network interface and a computer for running network software, wherein maintenance information concerning said X-ray exposure apparatus is communicated by data communication via a computer network.

15. The apparatus according to claim 14, wherein the network software is connected to an external network of a plant at which said X-ray exposure apparatus has been installed, said display is provided with a user interface for accessing a maintenance database provided by a vendor or user of said X-ray exposure apparatus, and information is obtained from said database via said external network.

16. A method of manufacturing devices, comprising steps of:

placing a plurality of items of semiconductor manufacturing equipment, inclusive of an X-ray exposure apparatus, in a plant; and manufacturing a semiconductor device using the plurality of items of semiconductor manufacturing equipment, wherein the X-ray exposure apparatus irradiates a reticle with X-rays generated from an X-ray source and irradiates a substrate with X-rays that have passed through the reticle to thereby transfer a pattern on the reticle to the substrate, the apparatus having:

(i) a plasma X-ray source for generating X-rays by producing plasma; and (ii) control means for controlling production of the plasma so that the plasma is produced at a plurality of positions in one irradiating operation of the substrate with X-rays, wherein the control means controls the X-ray intensity distribution in order to control the plurality of positions so that a required amount of defocusing, which is a size of a projection image corresponding to one point on the reticle formed by irradiating the reticle with X-rays generated at the plurality of positions, can be obtained.

17. The method according to claim 16, further comprising the steps of:

connecting the plurality of items of semiconductor manufacturing equipment by a local-area network;

connecting the local-area network and an external network outside the plant;

acquiring information concerning the X-ray exposure apparatus from a database on the external network utilizing said local-area network and said external network; and controlling the X-ray exposure apparatus based upon the information acquired.

18. The method according to claim 17, wherein maintenance information for the manufacturing equipment is obtained by accessing, by data communication via the external network, a database provided by a vendor of the manufacturing equipment or by a user, or production management is performed by data communication with a semiconductor manufacturing plant other than the first mentioned semiconductor manufacturing plant via the external network.

19. A method of maintaining an X-ray exposure apparatus, the method comprising the steps of:

preparing a database, which stores information relating to maintenance of the X-ray exposure apparatus, on an external network outside a plant at which the X-ray exposure apparatus has been installed;

connecting the X-ray exposure apparatus to a local-area network inside the plant; and maintaining the X-ray exposure apparatus, based upon information that has been stored in the database, utilizing the external network and the local-area network, wherein the X-ray exposure apparatus irradiates a reticle with X-rays generated from an X-ray source and irradiates a substrate with X-rays that have passed through the reticle to thereby transfer a pattern on the reticle to the substrate, the apparatus having:

(i) a plasma X-ray source for generating X-rays by producing plasma;

(ii) control means for controlling of production of the plasma so that the plasma is produced at a plurality of positions in one irradiating operation at the substrate with X-rays, wherein the control means controls the X-ray intensity distribution in order to control the plurality of positions so that a required amount of defocusing, which is a size of a projection image corresponding to one point on the reticle formed by irradiating the reticle with X-rays generated at the plurality of positions, can be obtained.

20. A method of controlling a proximity X-ray exposure apparatus for irradiating a reticle with X-rays generated from an X-ray source and irradiating a substrate with X-rays that have passed through the reticle, the method comprising:

a generating step of generating X-rays by producing plasma; and a control step of controlling X-ray intensity distribution by controlling production of the plasma so that the plasma is produced at a plurality of positions in one irradiating operation of the substrate with the X-rays, wherein said control step controls the X-ray intensity distribution in order to control the plurality of positions so that a required amount of defocusing, which is a size of a projection image corresponding to one point on the reticle formed by irradiating the reticle with X-rays generated at the plurality of positions, can be obtained.

21. The method according to claim 20, further comprising a determining step of determining a laser-light irradiation area on a target which functions as the X-ray source by generating X-rays in response to being irradiated with laser light, based upon an amount of defocusing required for the X-rays, the amount of defocusing representing a shape of an X-ray intensity distribution and being determined based upon importance of critical resolution and linearity between the mask pattern and resist pattern, wherein said control step controls the irradiation to irradiate with laser light a plurality of locations within the laser-light irradiation area on the target, which has been determined in said determining step.

22. The method according to claim 21, wherein said determining step determines the irradiation region based upon a value r obtained from $$\delta \times L/g$$

where $\delta$ represents the amount of defocusing which represents a standard deviation of X-ray intensity distribution, L the distance between the target and the reticle, and g the distance between the reticle and the substrate.

23. The method according to claim 22, wherein said determining step determines the irradiation area to be an area having a radius of 2r, and said control step controls operation for irradiating laser light so that the irradiation area on the target is irradiated with laser light in such a manner that irradiation density becomes a normal distribution having a standard deviation r which satisfies the following inequality, $$1.5 \text{ nm} \times L/g < r < 0.5 \times Wr \times L/g$$

where L represents the distance between the X-ray source and the reticle, g the distance between the reticle and the wafer, and Wr the least line width.

24. The method according to claim 22, wherein said determining step determines the irradiation area to be an area having a radius of $r \times \sqrt{3}$, and said control means controls operation for irradiating the irradiation area on said target with laser light in such a manner that irradiation density becomes uniform, the irradiation area has a diameter D which satisfies the following inequality, $$6 \text{ nm} \times L/g < D < 2 \times Wr \times L/g$$

where L represents the distance between the X-ray source and the reticle, g the distance between the reticle and the wafer, and Wr the least line width.

25. The method according to claim 21, further comprising a setting step of setting the amount of defocusing.

26. The method according to claim 21, wherein the plasma is produced by irradiating the target with laser light, the X-ray source has a mirror for reflecting the laser light in order that the laser light will arrive at the target, and said control step controls operation for irradiating with laser light a plurality of locations within the irradiation area on the target by changing the angle of the mirror during a single exposure operation.

27. The method according to claim 21, wherein the plasma is produced by irradiating the target with laser light, the X-ray source has a plurality of laser light sources for generating a plurality of laser beams for irradiating respective ones of different postitions on the target, and said control step controls operation for irradiating with laser light a plurality of locations within the irradiation area on the target by using a plurality of laser beams from the plurality of laser light sources during a single exposure operation.

28. A semiconductor manufacturing plant, comprising:

a plurality of items of semiconductor manufacturing equipment inclusive of an X-ray exposure apparatus;

a local-area network for interconnecting said plurality of items of manufacturing equipment; and a gateway for connecting said local-area network and an external network outside said semiconductor manufacturing plant, wherein said X-ray exposure apparatus irradiates a reticle with X-rays generated from an X-ray source and irradiates a substrate with X-rays that have passed through the reticle to thereby transfer a pattern on the reticle to the substrate, said apparatus having:

(i) a plasma X-ray source for generating X-rays by producing plasma; and (ii) control means for controlling production of the plasma so that the plasma is produced at a plurality of positions in one irradiating operation of the substrate with X-rays, wherein said control means controls the X-ray intensity distribution in order to control the plurality of positions so that a required amount of defocusing, which is a size of a projection image corresponding to one point on the reticle formed by irradiating the reticle with X-rays generated at the plurality of positions, can be obtained.

* * * * *